(12) United States Patent
Bower et al.

(10) Patent No.: US 11,495,172 B2
(45) Date of Patent: *Nov. 8, 2022

(54) PIXEL GROUP AND COLUMN TOKEN DISPLAY ARCHITECTURES

(71) Applicant: X Display Company Technology Limited, Dublin (IE)

(72) Inventors: Christopher Andrew Bower, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/074,596

(22) Filed: Oct. 19, 2020

(65) Prior Publication Data

US 2022/0122519 A1 Apr. 21, 2022

(51) Int. Cl.
*G09G 3/32* (2016.01)
*H01L 25/16* (2006.01)
*G09G 3/3208* (2016.01)

(52) U.S. Cl.
CPC .......... *G09G 3/32* (2013.01); *G09G 3/3208* (2013.01); *H01L 25/167* (2013.01); *G09G 2310/0202* (2013.01); *G09G 2310/0275* (2013.01); *G09G 2310/08* (2013.01)

(58) Field of Classification Search
CPC ............ G09G 3/32; G09G 3/3208; G09G 2310/0202; G09G 2310/0275; G09G 2310/08; H01L 25/167

USPC .............................................. 345/214, 76, 55
See application file for complete search history.

(56) References Cited

U.S. PATENT DOCUMENTS

| | | |
|---|---|---|
| 5,550,066 A | 8/1996 | Tang et al. |
| 7,622,367 B1 | 11/2009 | Nuzzo et al. |
| 7,880,184 B2 | 2/2011 | Iwafuchi et al. |
| 8,506,867 B2 | 8/2013 | Menard |
| 8,722,458 B2 | 5/2014 | Rogers et al. |
| 9,177,510 B2* | 11/2015 | Miyake ............... G09G 3/3426 |
| 9,520,537 B2 | 12/2016 | Bower et al. |
| 9,930,277 B2 | 3/2018 | Cok |

(Continued)

OTHER PUBLICATIONS

Cok, R. S. et al., Inorganic light-emitting diode displays using micro-transfer printing, Journal of the SID, 25(10):589-609, (2017).

(Continued)

*Primary Examiner* — Jason M Mandeville
(74) *Attorney, Agent, or Firm* — Choate, Hall & Stewart LLP; Michael D. Schmitt

(57) ABSTRACT

A flat-panel display comprises a display substrate, an array of pixels distributed in rows and columns over the display substrate, the array having a column-control side, and column controller disposed on the column-control side of the array providing column data to the array of pixels through column-data lines. In some embodiments, rows of pixels in the array of pixels form row groups and each column of pixels in a row group receives column data through a separate column-data line. In some embodiments, each pixel in each column of pixels in the array of pixels is serially connected and each pixel in the array of pixels comprises a token-passing circuit for passing a token through the serially connected column of pixels.

11 Claims, 16 Drawing Sheets

(56) References Cited

U.S. PATENT DOCUMENTS

| | | |
|---|---|---|
| 9,991,163 B2 | 6/2018 | Bower et al. |
| 10,360,846 B2 | 7/2019 | Cok et al. |
| 2009/0295697 A1 | 12/2009 | Su |
| 2010/0253668 A1* | 10/2010 | Sugihara ............... G09G 3/3614 345/100 |
| 2010/0309179 A1 | 12/2010 | Missbach |
| 2011/0057861 A1* | 3/2011 | Cok .................... H01L 51/5209 345/1.3 |
| 2015/0372053 A1 | 12/2015 | Bower et al. |
| 2016/0064363 A1 | 3/2016 | Bower et al. |
| 2016/0093600 A1 | 3/2016 | Bower et al. |
| 2017/0025593 A1 | 1/2017 | Bower et al. |
| 2017/0048393 A1 | 2/2017 | Bostick et al. |
| 2017/0061867 A1 | 3/2017 | Cok et al. |
| 2017/0083468 A1* | 3/2017 | Sengoku ............... G06F 13/404 |
| 2017/0186356 A1 | 6/2017 | Cok |
| 2017/0187976 A1 | 6/2017 | Cok |
| 2017/0330509 A1 | 11/2017 | Cok et al. |
| 2018/0019747 A1 | 1/2018 | Ikegawa et al. |
| 2018/0033853 A1 | 2/2018 | Bower et al. |
| 2018/0191978 A1 | 7/2018 | Cok et al. |
| 2018/0197471 A1 | 7/2018 | Rotzoll et al. |
| 2018/0323180 A1 | 11/2018 | Cok |
| 2019/0180675 A1 | 6/2019 | Jang et al. |
| 2022/0122520 A1 | 4/2022 | Cok et al. |

OTHER PUBLICATIONS

Cok, R. S. et al., AMOLED displays with transfer-printed integrated circuits, Journal of SID, 19(4):335-341, (2011).

Cok, R. S. et al., 60.3: AMOLED Displays Using Transfer-Printed Integrated Circuits, Society for Information Display, 10:902-904, (2010).

* cited by examiner

PIXEL GROUP AND COLUMN TOKEN DISPLAY ARCHITECTURES

CROSS REFERENCE TO RELATED APPLICATIONS

Reference is made to U.S. Pat. No. 9,930,277, filed Jan. 21, 2016, entitled Serial Row-Select Matrix Addressed System by Cok and to U.S. Pat. No. 10,360,846 filed May 9, 2017, entitled Distributed Pulse-Width Modulation System with Multi-Bit Digital Storage and Output Device by Cok et al., the disclosures of which are incorporated herein by reference in their entirety.

FIELD OF THE DISCLOSURE

The present disclosure relates to active-matrix display architectures having row and column control signals.

BACKGROUND OF THE DISCLOSURE

Flat-panel displays are widely used in conjunction with computing devices, in portable electronic devices, and for entertainment devices such as televisions. Such displays typically employ an array of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light-emitting diodes (LEDs) as pixel elements are also in widespread use for outdoor signage and have been demonstrated in a 55-inch television.

Displays are typically controlled with either a passive-matrix (PM) control scheme employing electronic control circuitry external to the pixel array or an active-matrix (AM) control scheme employing electronic control circuitry in the pixels on the display substrate and associated with each light-emitting element. Both OLED displays and LCDs using passive-matrix control and active-matrix control are available. An example of such an AM OLED display device is disclosed in U.S. Pat. No. 5,550,066. In a PM-controlled display, each pixel in a row is stimulated to emit light at the same time while the other rows do not emit light and each row is sequentially activated at a high rate to provide the illusion that all of the rows simultaneously emit light. In contrast, in an AM-controlled display, data is concurrently provided to and stored in pixels in a row and the rows are sequentially activated to load the data in the activated row. Each pixel emits light corresponding to the stored data when pixels in other rows receive data so that all of the rows of pixels in the display emit light at the same time, except possibly the row loading pixels. In such AM systems, the row activation rate can be much slower than in PM systems, for example divided by the number of rows. Nonetheless, for AM displays, such as HD, 4 k, or 8 k displays with a large number of rows, the rate at which data must be loaded into successive rows can be greater than desired over relatively large display substrates, for example greater than one, two, or three meters, so that power, ground, and signal distribution can degrade, leading to difficulties in proper pixel control.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon or polycrystalline silicon and is distributed over the entire flat-panel display substrate. The semiconductor layer is photolithographically processed to form electronic control elements, such as transistors and capacitors. Additional layers, for example insulating dielectric layers and conductive metal layers are provided, often by evaporation or sputtering, and photolithographically patterned to form electrical interconnections, or wires. In some implementations, small integrated circuits (ICs) with a separate IC substrate disposed on a display substrate control pixels in an AM display. The integrated circuits can be disposed on the display substrate using micro-transfer printing, for example as taught in U.S. Pat. No. 9,930,277 referenced above.

Typically, each display sub-pixel is controlled by one control element, and each control element includes at least one transistor. For example, in a simple active-matrix organic light-emitting diode (OLED) display, each control element includes two transistors (a select transistor and a power transistor) and one capacitor for storing a charge specifying the luminance of the sub-pixel. Each OLED element employs an independent control electrode connected to the power transistor and a common electrode. In contrast, an LCD typically uses a single transistor to control each pixel. Control of the light-emitting elements is usually provided through a data signal line (column-data line), a select signal line (row-select line), a power connection, and a ground connection. Active-matrix elements are not necessarily limited to displays and can be distributed over a substrate and employed in other applications requiring spatially distributed control.

There remains a need for active-matrix display systems that provide improved signal distribution over relatively large display substrates.

SUMMARY

The present disclosure includes, among various embodiments, a flat-panel display comprising a display substrate, an array of pixels distributed in rows and columns over the display substrate, the array having a column-control side, and a column controller disposed on the column-control side of the array operable to provide column data to the pixels in the array of pixels through column-data lines. (Column-data lines can be wires or traces on the display substrate, for example metal wires.) Rows of pixels in the array of pixels are arranged in row groups. For each row group of the row groups, each column of pixels in the row group receives column data from the column controller through a separate one of the column-data lines, and no pixel of the array of pixels in any other row group receives column data through the separate one of the column-data lines. Thus, the pixels in each row group receive column data through different column-data lines than pixels in any other row group. Columns of pixels in each row group receive common column data.

The number of row groups can be equal to two or greater than two, for example three, four, five, eight, ten, twelve, or sixteen. In some embodiments, the row groups can be spatially adjacent over the display substrate. In some embodiments, the rows in the row groups are spatially interdigitated over the display substrate.

Each pixel can comprise one or more inorganic micro-light-emitting-diodes. Each inorganic micro-light-emitting-diodes can have a length and width no greater than 200 microns, no greater than 100 microns, no greater than 50 microns, no greater than 20 microns, no greater than 10 microns, no greater than 5 microns, or no greater than 3 microns.

Some embodiments of the present disclosure comprise a row controller operable to provide row-select signals through row-select lines to rows of pixels in each of the row groups in the array of pixels. (Row-select lines can be wires or traces on the display substrate, for example metal wires.) Each row-select line can be electrically separate and independently controlled by the row controller from every other of the row-select lines. Row-select lines in different ones of the row groups can be electrically connected and commonly controlled by the row controller or rows of pixels in different row groups can alternate over the display substrate so that rows of pixels in different ones of the row groups are interdigitated and commonly connected. The row controller can comprise row-control circuits that are serially connected, for example in a daisy chain. Each row-control circuit can comprise a token-passing circuit for passing a row-select token through the serially connected row-control circuits. The row controller can provide timing signals to the pixels. The row controller can comprise a single integrated circuit or multiple, electrically connected integrated circuits.

In some embodiments, each pixel comprises a pixel timing circuit. The timing circuits in each pixel can operate independently of the timing circuits in other pixels and can each generate time-dependent control signals for controlling the brightness of the light emitters in the pixel. Inorganic micro-light-emitting diodes can efficiently operate at a desired current density and can therefore operate efficiently at a constant current where pixel brightness is controlled by controlling the length of time that the inorganic micro-light-emitting diodes are operating (e.g., operated in a pulse width modulation mode).

According to some embodiments of the present disclosure, for each column of the pixels in each of the row groups, each pixel in the column is serially connected (e.g., with wires or traces comprising metal or other electrical conductors such as a transparent conductive oxide or nanowires) and each pixel in the array of pixels comprises a token-passing circuit for passing a row-select token through each column of serially connected pixels in each of the row groups. In some embodiments, the rows form a single row group and the column controller provides a row-select token to a single row of pixels, the pixels in each column can be serially connected, and each pixel in the array of pixels can comprise a token-passing circuit for passing a row-select token through the serially connected column of pixels. In some embodiments, the rows are divided into multiple row groups, the column controller provides a row-select token to at least one row of pixels in each of the row groups of the multiple row groups, the pixels in each column in each row group can be serially connected, and each pixel in the array of pixels can comprise a token-passing circuit for passing a row-select token through the serially connected column of pixels in each row group. In some embodiments, the rows are divided into multiple row groups, the column controller can provide a row-select token to at least one (e.g., one) row of pixels in only one of the row groups of the multiple row groups, the pixels in each column in each row group can be serially connected, the row groups are serially connected (e.g., pixels in different row groups are serially connected with serial connections), and each pixel in the array of pixels can comprise a token-passing circuit for passing a row-select token through the serially connected column of pixels in each row group.

According to some embodiments, wires (for example column-data lines and serial connection lines) occupy no less than 5%, no less than 10%, no less than 20%, no less than 50%, no less than 60%, no less than 70%, no less than 80%, or no less than 90% of the area between the columns of pixels in a display area defined by a convex hull of the pixels 20 on a surface of the display substrate on which the pixels are disposed. Pixels can be disposed between wires on the display substrate in the display area and not over or under wires on the display substrate in the display area.

According to some embodiments of the present disclosure, each of the columns of pixels in the array of pixels comprises pixels in two or more different ones of the row groups. Each column of pixels in the array of pixels can comprise pixels that are electrically connected to different ones of the column-data lines.

According to some embodiments of the present disclosure, a flat-panel display comprises a display substrate, an array of pixels distributed in rows and columns over the display substrate, and a column controller operable to provide column data to the pixels in the array through column-data lines. The rows of pixels in the array of pixels are arranged in row groups and each of the column-data lines electrically connects to only one column of pixels in one of the row groups (e.g., the pixels in one column of one of the row groups). Each of the columns of pixels in the array of pixels can comprise pixels in two or more different ones of the row groups. Each column of pixels in the array can comprise pixels that are electrically connected to different ones of the column-data lines. The rows of pixels in the array can be electrically connected to a row controller operable to provide row-select signals to the rows of pixels.

According to some embodiments, for each column of the columns of pixels in the array, the column of pixels comprises two or more subsets of pixels and, for each subset of the two or more subsets of pixels, only the pixels in the subset are electrically connected to a separate one of the column-data lines. The pixels in each of the rows of pixels in the array can be electrically connected with a corresponding row-select line.

According to some embodiments, for each row of the rows of pixels in the array, each pixel in the row is in a column of the array, each pixel in the row is electrically connected to a separate one of the column-data lines, and the separate column-data line is electrically connected to less than all of the pixels in the column of the array.

According to some embodiments of the present disclosure, a display comprises an array of pixels distributed in M rows and N columns, the array having a column-control side. Rows of pixels in the array of pixels form G row groups, G greater than one, and a column controller disposed on the column-control side of the array is operable to provide column data to the array of pixels through N×G separate column-data lines.

According to some embodiments of the present disclosure, a method of controlling a flat-panel display comprises providing, by a column controller, first column data on a first column-data line to first pixels in a column of an array of pixels that are in a first row group; and providing, by the column controller, second column data on a second column-data line to second pixels in the column of the array of pixels that are in a second row group. The first column-data line and the second column-data line are different column-data lines and the first column data and the second column data are provided concurrently and at the same time and can provide different column data. In some embodiments, the first column of pixels in the first row group and the second column of pixels in the second row group are in a common column of the array of pixels. Some embodiments comprise providing a row-select token to a row of pixels in each of the first row group and the second row group by the column controller. Some embodiments comprise providing a row-select token to a single row of pixels in the array of pixels by the column controller and row-select tokens are provided from one row of pixel in a row group to another row of pixels in a different row group, for example through serial connection lines (wires).

According to embodiments of the present disclosure, a flat-panel display comprises a display substrate, an array of pixels distributed in rows and columns over the display substrate, and a column controller disposed over the display substrate is operable to provide data to the array of pixels through column-data lines. Each pixel in each column of pixels in the array of pixels is serially connected and each pixel in the array of pixels comprises a token-passing circuit for passing a row-select token through the serially connected column of pixels.

Each of the pixels can comprise one or more inorganic micro-light-emitting-diodes (LEDs), for example red-light-emitting red LEDs, green-light-emitting green LEDs, and blue-light-emitting blue LEDs. Each of the inorganic micro-light-emitting-diodes can have a length and width no greater than 200 microns, no greater than 100 microns, no greater than 50 microns, no greater than 20 microns, or no greater than 100 microns. Such small LEDs leave space on the display substrate for additional column-data lines and serial connections.

The column controller can be operable to provide a row-select token to the pixels in a row of the array of pixels. Rows of pixels can be arranged in row groups. Each pixel in each column of row groups can be serially connected. Each column of pixels in a row group can receive column data through a separate column-data line. In some embodiments, no other pixel of the array of pixels in any other row group receives column data through the separate one of the column-data lines. Thus, pixels in different row groups receive column data from the column controller through different column-data lines. The number of row groups can be greater than two. The column controller can provide a token (e.g., a row-select token) to the pixels in at least one (e.g., one) row of each of the row groups. The row-select token can be provided to a row of every row group at the same time or can be provided to a row of only one of the row groups and the row-select token can be passed sequentially from row group to row group.

Rows of pixels in different ones of the row groups can be interdigitated.

According to some embodiments, the array of pixels has a column-control side and the column controller is disposed on the column-control side of the array. Wires, for example column-data lines can occupy no less than 5%, 10%, 20%, 50%, 60% 70%, 80%, or 90% of the area between at least a portion of the columns of pixels on a surface of display substrate on which the pixels are disposed, for example between columns of pixels in the display are of the display substrate.

Each of the pixels can comprise a pixel timing circuit that controls the pixel or that controls the amount of time a light-emitting in the pixel emits light, for example at a constant current. The pixel timing circuit in each pixel can be separate and operate independently of the pixel timing circuit in any other pixel. The pixel timing circuit can be a digital circuit providing pulse width modulation control or an analog circuit comprising one or more charge-storage capacitors.

According to embodiments of the present disclosure, a method of controlling a flat-panel display comprises providing a display and providing a row-select token to a row of pixels in the array of pixels by the column controller. In some embodiments, methods of the present disclosure comprise providing a row-select token to a row of pixels in each row group by the column controller. In some embodiments, methods of the present disclosure comprise providing a row-select token to one row of pixels in one row group by the column controller.

According to embodiments of the present disclosure, a flat-panel display comprises an array of pixels distributed in rows and columns and a column controller operable to provide data to the array of pixels and exclusively controlling the array of pixels (e.g., by providing row-select tokens through serial connections) so that no row controller is needed or used to control the flat-panel display. The array of pixels can have a column-control side and the column controller can be disposed on the column-control side of the array. In some embodiments, flat-panel display control circuits on the display substrate outside of the display area are disposed only on the column-control side.

Each of the pixels can comprise one or more inorganic micro-light-emitting-diodes, for example three LEDs in a color pixel. Each of the inorganic micro-light-emitting-diodes can have a length and a width each no greater than 200 microns, no greater than 100 microns, no greater than 50 microns, no greater than 20 microns, no greater than 215 microns, or no greater than 10 microns and each of the pixels can comprise a pixel timing circuit.

Embodiments of the present disclosure provide active and passive display control methods and architectures that enable improved control of large-substrate displays with a large number of pixels using lower-frequency signals and fewer control lines.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
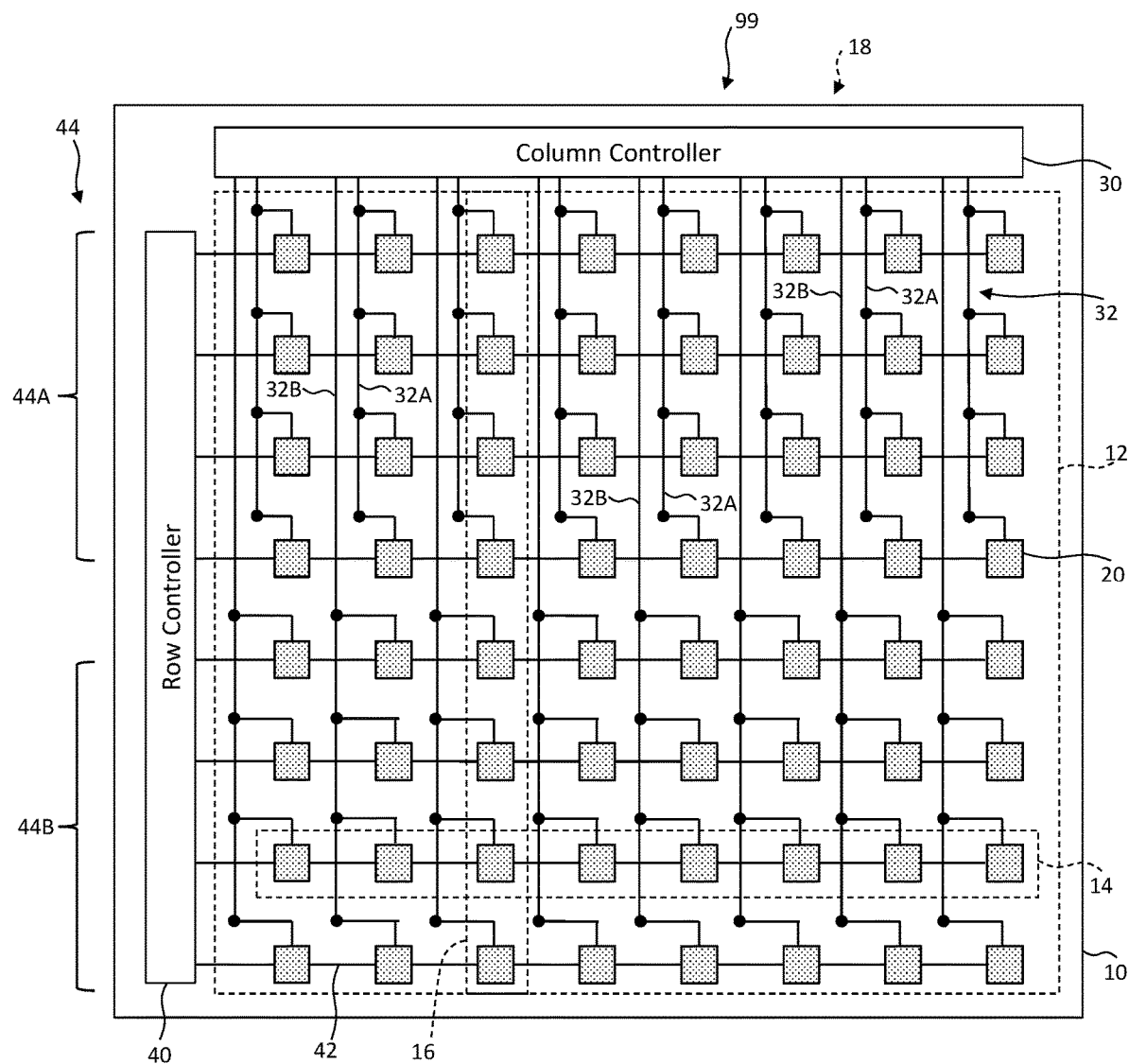
FIG. 1 is a schematic plan view of a display having two row groups according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide, inter alia, active- and passive-matrix display control methods and architectures that enable improved control of flat-panel displays (e.g., large-substrate displays) using lower-frequency signals and fewer control lines of greater size. The pixels can comprise inorganic light-emitting diodes and the displays can be analog or digital displays.

According to some embodiments of the present disclosure and as illustrated in FIG. 1, a flat-panel display 99 comprises a display substrate 10, an array 12 of pixels 20 distributed in rows 14 and columns 16 over display substrate 10. Array 12 can define a display area on display substrate 10 and has a column-control side 18. A column controller 30 is disposed on column-control side 18 of array 12 and provides column data to array 12 of pixels 20 through column-data lines 32. Each column-data line 32 (e.g., column-data line 32A or column-data line 32B, collectively column-data lines 32) connects at least a portion of each column 16 of pixels 20 to column controller 30. According to some embodiments, rows 14 of pixels 20 in array 12 form row groups 44 (e.g., row group 44A, row group 44B, collectively row groups 44) and each column 16 of pixels 20 in a row group 44 receives column data through a separate column-data line 32. Column-data lines 32 can independently and at the same time transmit column data to each column 16 of pixels 20 in each row group 44. According to some embodiments, a flat-panel display 99 comprises two or more row groups 44. According to some embodiments, the number of row groups 44 evenly divides the number of rows 14 in array 12 of pixels 20. In some embodiments, the number of row groups 44 does not evenly divide the number of rows 14 in array 12 of pixels 20. According to some embodiments, rows 14 of pixels 20 are controlled by a row controller 40 that provides row-control signals (e.g., row-select signals and timing signals) on row-select lines 42 to pixels 20. In general, column-data lines 32 can extend in a direction (e.g., vertically or in a y direction) over display substrate 10 and row-select lines 42 can extend in a direction orthogonal to column-data lines 32 (e.g., horizontally or in an x direction). Horizontal and vertical are arbitrary orthogonal directions.

Display substrate 10 can be any useful substrate on which pixels 20 and column-data lines 32 can be suitably disposed, for example glass, plastic, resin, fiberglass, semiconductor, ceramic, quartz, sapphire, or other substrates found in the display or integrated circuit industries. Display substrate 10 can be flexible or rigid and can be substantially flat. Column-data lines 32 and row-select lines 42 can be wires (e.g., photolithographically defined electrical conductors such as metal lines) disposed on display substrate 10 that conduct electrical current from column controller 30 to columns 16 of pixels 20 and electrical current from row controller 40 to rows 14 of pixels 20.

Column controller 30 can be, for example, an integrated circuit that provides control, timing (e.g., clocks) or data signals (e.g., column-data signals) through column-data lines 32 to columns 16 of pixels 20 to enable pixels 20 to control light in flat-panel display 99. Each column-data line 32 can be electrically separate and optionally independently controlled from every other column-data line 32 by column controller 30. Column controller 30 can be disposed completely and exclusively on column-control side 18 (e.g., as shown in FIG. 1). Column controller 30 can comprise a single integrated circuit or can comprise multiple integrated circuits, e.g., electrically connected integrated circuits. The integrated circuit(s) can be micro-transfer printed as unpackaged dies and can comprise fractured or separated tether(s).

Row controller 40 can be, for example, an integrated circuit that provides control signals (e.g., row-select signals) and/or timing signals (e.g., clocks or timing signals such as pulse-width modulation (PWM) signals) through row-select lines 42 to rows 14 of pixels 20 to cause pixels 20 to control light in flat-panel display 99. Each row-select line 42 can be electrically separate and optionally independently controlled from every other row-select line 42 by row controller 40. Row controller 40 can be disposed completely and exclusively on a side of display substrate 10 adjacent to column-control side 18 (e.g., as shown in FIG. 1). Row controller 40 can comprise a single integrated circuit or can comprise multiple integrated circuits, e.g., electrically connected integrated circuits. The integrated circuit(s) can be micro-transfer printed as unpackaged dies and can comprise fractured or separated tether(s).

Array 12 of pixels 20 can be a completely regular array 12 (e.g., as shown in FIG. 1) or can have rows 14 or columns 16 of pixels 20 that are offset from each other, so that rows 14 or columns 16 of pixels 20 are not disposed in a straight line and can, for example, form a zigzag line (not shown in the Figures) or, as another example, have non-uniform spacing(s).

Figure 2:
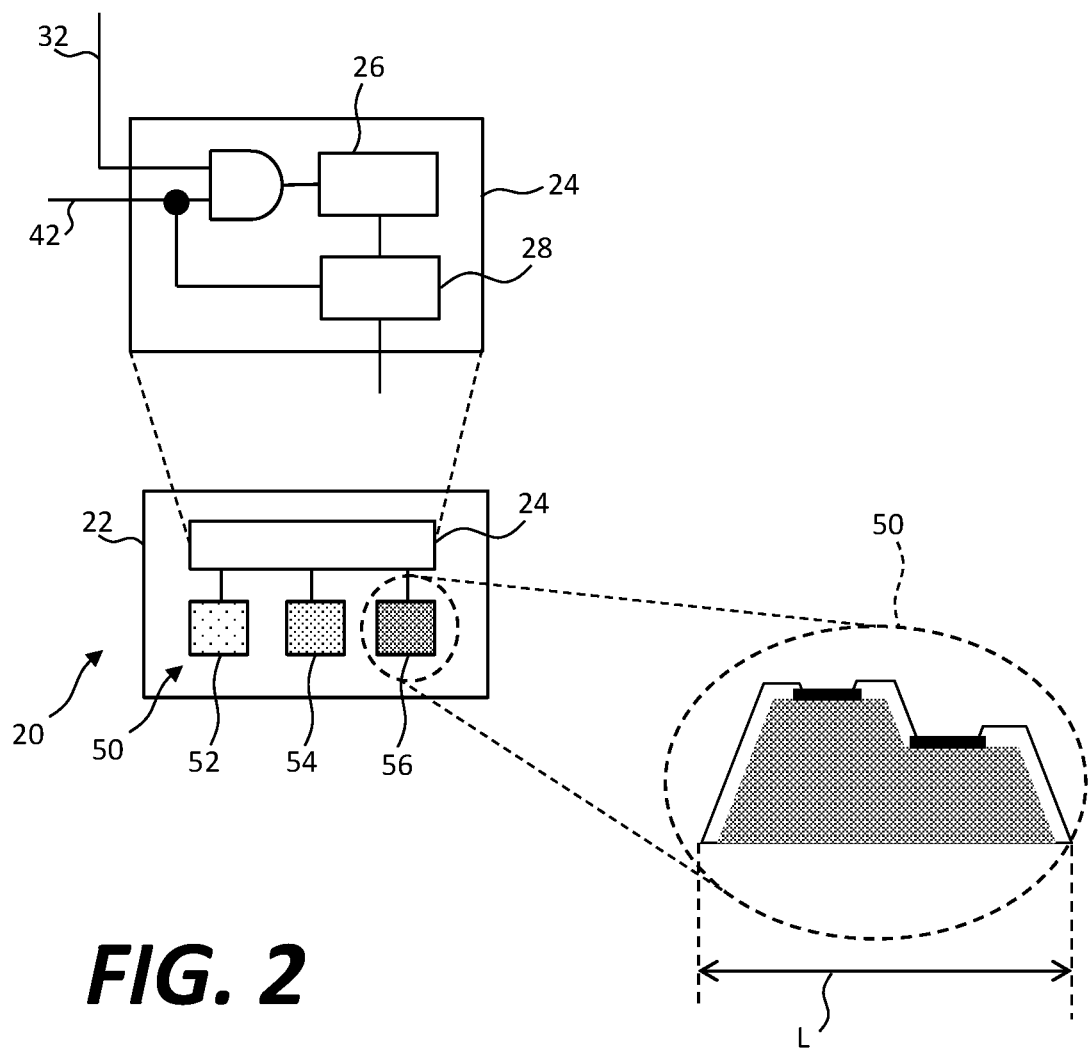
FIG. 2 is a schematic circuit diagram and details of a pixel according to illustrative embodiments of the present disclosure.

Pixels 20 can be active- or passive-matrix pixels 20, can be analog or digital, and comprise one or more light-controlling elements, for example light emitter(s) such as light-emitting diode(s) 50 (LED(s) 50). Pixels 20 can comprise light-emitting diodes 50, e.g., inorganic light-emitting diodes 50 such as horizontal inorganic light-emitting diodes 50 (e.g., as shown in the detail of FIG. 2) or vertical inorganic light-emitting diodes 50 (not shown in the Figures). Inorganic light-emitting diodes 50 can have a small area, for example having a length and a width each no greater than 20 microns, no greater than 50 microns, no greater than 100 microns, or no greater than 200 microns. Such small light emitters leave additional area on display substrate for more or larger wires, e.g., additional column-data lines 32, serial connections 60, or ground and power wires.

As shown in more detail in FIG. 2, in certain active-matrix embodiments of the present disclosure, pixels 20 can comprise a pixel controller 24. Pixels 20 can comprise a red light-emitting diode 52 that emits red light, a green light-emitting diode 54 that emits green light, and a blue light-emitting diode 56 that emits blue light (collectively light-emitting diodes 50 or LEDs 50) under the control of pixel controller 24. In certain embodiments, light emitters that emit light of other color(s) are included in pixel 20, such as a yellow light-emitting diode. Light-emitting diodes 50 can be mini-LEDs (e.g., having a largest dimension no greater than 500 microns) or micro-LEDs (e.g., having a largest dimension of less than 100 microns). Pixels 20 can emit one color of light or white light (e.g., as in a black-and-white display) or multiple colors of light (e.g., red, green, and blue light as in a color display). Pixels 20 can comprise multiple elements (e.g., pixel controller 24 and LEDs 50) disposed and electrically connected directly on display substrate 10 or can comprise multiple elements disposed and electrically connected on a pixel substrate 22 separate and independent from display substrate 10 with pixel substrate 22 disposed on display substrate 10. Any one or more of pixel controller 24 and LEDs 50 can be micro-transfer printed onto display substrate 10 or onto pixel substrate 22. If pixel controller 24 and LEDs 50 are disposed on separate and independent pixel substrate 22 to form pixel 20, pixel 20 (with pixel substrate 22) can be micro-transfer printed from a pixel source substrate onto display substrate 10 and electrically connected to control signal wires (e.g., row-control, column-data, power, and ground signal wires) on display substrate 10. Micro-transfer printed devices or structures (e.g., LEDs 50, pixel controller 24, or pixel 20) can comprise fractured or separated tether(s) as a consequence of micro-transfer printing from a source to a target substrate.

According to some embodiments of the present disclosure, an active-matrix pixel controller 24 receives column-data signals from column controller 30 through column-data line 32 and row-select signals from row controller 40 through row-select line 42. When a pixel 20 is selected by row-select line 42 (e.g., controlled by pixel controller 24 AND gate), data received from column-data line 32 is stored in pixel memory 26 and, using a pixel timing circuit 28, controls light-emitting diodes 50 to emit light. (Pixel controller 24 as illustrated in the detail of FIG. 2 is a simplified schematic and does not include all of the logic circuits necessary to actually implement the desired functionality. U.S. Patent Publication No. 2018/019747 describes circuits useful in such application and its contents are entirely incorporated by reference herein.) Pixel memory 26 can be a digital memory (e.g., an SRAM or shift register storing digital values representing the desired brightness of each light-emitting diode 50) or an analog memory (e.g., one or more capacitors storing a charge representing the desired brightness of each light-emitting diode 50). Pixel controllers 24 can be thin-film circuits. According to some embodiments of the present disclosure, pixel controllers 24 comprise integrated circuits formed in a crystalline semiconductor (e.g., silicon) substrate that are transferred from a native source wafer to non-native display substrate 10 or to a non-native pixel substrate 22, for example by micro-transfer printing. As a consequence of micro-transfer printing, pixel controller 24 can comprise a fractured or separated control-ler tether. Such crystalline circuits have much better performance and a smaller size than thin-film semiconductor circuits. The smaller size of pixel controller 24 provides additional area over display substrate 10 for additional or larger column-data lines 32 or serial connections 60, enabling embodiments of the present disclosure.

According to some embodiments of the present disclosure and as shown in the detail of FIG. 2, pixels 20 comprise inorganic micro-light-emitting diodes 50 that have a length L and a width over display substrate 10 or pixel substrate 22 that is no greater than 100 microns (e.g., no greater than 50 microns, no greater than 20 microns, no greater than 15 microns, no greater than 12 microns, no greater than 10 microns, no greater than 8 microns, no greater than 5 microns, or no greater than 3 microns). Such relatively small light emitters disposed on a relatively large display substrate 10 (for example a laptop display, a monitor display, or a television display) take up relatively little area on display substrate 10 so that the fill factor of LEDs 50 on display substrate 10 (e.g., the aperture ratio or the ratio of the sum of the areas of LEDs 50 over display substrate 10 to the convex hull area of display substrate 10 that includes LEDs 50 or minimum rectangular area of pixel 20 array 12) is no greater than 30% (e.g., no greater than 20%, no greater than 10%, no greater than 5%, no greater than 1%, no greater than 0.5%, no greater than 0.1%, no greater than 0.05%, or no greater than 0.01%). For example, an 8K display (having a display array 12 bounding 8192 by 4096 display pixels 20) over a 2-meter diagonal 9:16 display with micro-LEDs 50 having a 15-micron length and 8-micron width has a fill factor of much less than 1%. An 8K display having 40 micron by 40 micron pixels 20 can have a fill factor of about 3%. According to embodiments of the present disclosure, because the display area fill factor of the micro-LEDs 50 can be so small, timing and row select functions can be integrated into pixels 20 in the display area rather than integrated into circuits external to the display area (e.g., into row controller 40) so that wiring in the display area is reduced (e.g., in number) and/or individual wire size can be increased (e.g., without needing to increase the number of wiring layers) and display and pixel control is simplified. Circuits and structures of this size suitable for embodiments of the present disclosure have been designed and constructed. As discussed in U.S. Pat. No. 9,991,163, whose contents are incorporated by reference herein, a display substrate 10 having such a small fill factor can use the remaining area of display substrate 10 to provide other functionality.

According to some embodiments of the present disclosure, the remaining area not occupied by pixels 20 is used at least partly to provide additional column-data lines 32 to separately control or communicate with row groups 44 of pixel 20 rows 14. By separately controlling or communicating with separate row groups 44, pixels 20 in different row groups 44 can receive signals (for example data) at the same time, reducing the communication frequency necessary and increasing the time available to send the control or data signals from column controller 30 to pixels 20. Lower-frequency signals can be transmitted over larger areas with an improved signal-to-noise ratio and are therefore more reliable and robust. Moreover, the remaining area can also be used to form larger or wider column-data lines 32 having reduced resistance. Thus, according to some embodiments of the present disclosure, larger flat-panel displays 99 can be controlled more easily with fewer communication errors and improved power and ground distribution and with fewer integrated circuits.

In contrast to embodiments of the present disclosure, existing prior-art flat-panel displays have a desirably large fill factor. For example, the lifetime of OLED displays is increased with a larger fill factor because such a larger fill factor reduces current density and improves organic material lifetimes. Similarly, liquid-crystal displays (LCDs) have a desirably large fill factor to reduce the necessary brightness of the backlight (because larger pixels transmit more light), improving the backlight lifetime and display power efficiency. Thus, prior displays cannot reduce control frequency and improve control line conductivity because there is no space on their display substrates for additional or larger control lines, in contrast to embodiments of the present disclosure. In some embodiments of the present disclosure, any two or more of pixels 20, column-data lines 32, and row-select lines 42 are disposed in a common layer on display substrate 10 and pixels 20 are not, for example, disposed over or below column-data lines 32 and row-select lines 42. Display substrate 10 costs are reduced by disposing any two or more of pixels 20, column-data lines 32, and row-select lines 42 in a common layer.

As shown in the embodiments of FIG. 1, in some embodiments, rows 14 of pixels 20 in array 12 are arranged in two row groups 44, row group 44A and row group 44B. (More row groups 44 can be used, for example, for larger or higher definition displays.) Each of row group 44A and row group 44B are individually and independently connected by a different set of column-data lines 32 (e.g., column-data lines 32A and column-data lines 32B, respectively) to column controller 30. Different pixels 20 in different row groups 44 in the same column 16 are connected to different column-data lines 32, as can be seen in each of the columns 16 of pixels 20 in FIG. 1 (where the top four pixels 20 of each column 16 are connected to a separate column-data line 32A from column-data line 32B that connects the bottom four pixels 20 in the column 16). Thus, column controller 30 can provide column-data signals at the same time to pixels 20 in different row groups 44. At the same time, row controller 40 can provide corresponding row-select signals to rows 14 in the different row groups 44 at the same time. For example, FIG. 1 illustrates an eight by eight array 12 of pixels 20 arranged in eight rows 14 and eight columns 16. The eight rows 14 of pixels 20 are divided into two row groups 44A and 44B. Row controller 40 can select pixels 20 in first row 14 (in row group 44A) and pixels 20 in fifth row 14 (in row group 44B) at the same time. Correspondingly, column controller 30 provides column data to each column in row group 44A and row group 44B at the same time on column-data lines 32A and 32B, respectively, so that pixels 20 in first row 14 in row group 44A are selected to receive data on column-data lines 32A at the same time as pixels 20 in fifth row 14 in row group 44B receive data on column-data lines 32B. Because different column-data lines 32 (e.g., column-data lines 32A and column-data lines 32B) are connected to rows 14 of pixels 20 in different row groups 44, pixels 20 in first row 14 (in row group 44A) can receive different column data from pixels 20 in fifth row 14 (first row 14 in row group 44B). Once first and fifth rows 14 of pixels 20 are loaded with data (or, in a passive-matrix embodiment, emit light), pixels 20 in second row 14 (in row group 44A) and sixth row 14 (second row 14 in row group 44B) can be selected by row controller 40 and provided with column data by column controller 30 through column-data lines 32A and 32B, respectively. The process continues for each subsequent row 14 in each row group 44 until all of rows 14 in array 12 are selected and provided with data. The process then repeats for the next set of column data (e.g., corresponding to an image frame). Because, in some embodiments, as in FIG. 1, two row groups 44A, 44B and two sets of column-data lines 32A, 32B are used to control pixels 20, the data rate can be one half of a conventional display architecture having one row group 44 and one set of column-data lines 32, enabling improved signal integrity.

Figure 3:
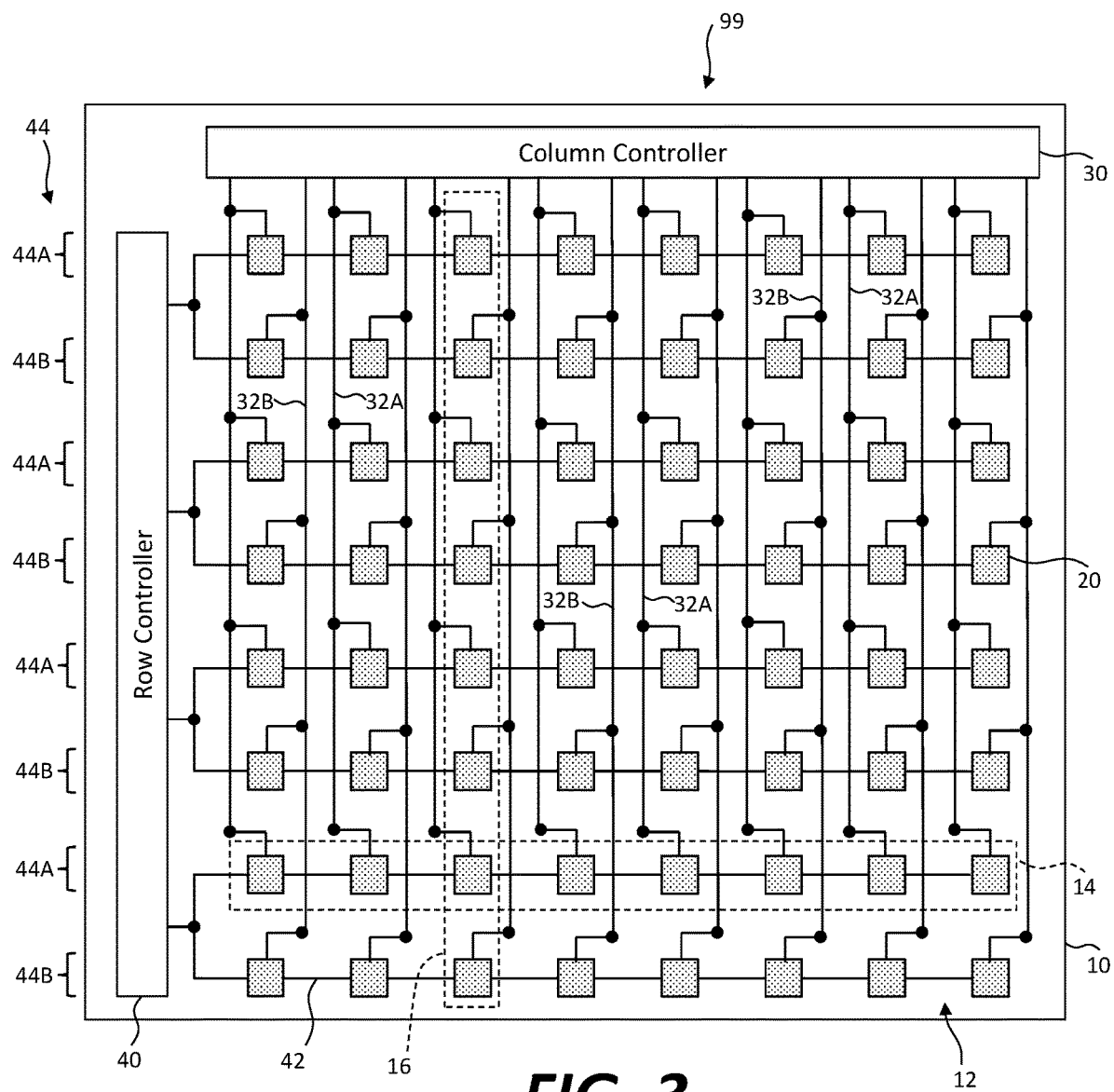
FIG. 3 is a schematic plan view of a display having two interdigitated row groups according to illustrative embodiments of the present disclosure.

In some embodiments, and as shown in FIG. 1, row groups 44 are disposed in the top half and the bottom half of flat-panel display 99. In some embodiments, and as illustrated in the schematic plan view of FIG. 3, row-select lines 42 in different row groups 44 are interdigitated and electrically connected and commonly controlled by row controller 40. Such an arrangement can simplify the layout of display substrate 10 and the circuits in row controller 40. As shown in FIG. 3, a row 14 of pixels 20 in row group 44A is electrically connected and controlled in common with an adjacent row 14 of pixels 20 in row group 44B. Rows 14 of each row group 44 alternate over display substrate 10. In some embodiments, more than two row groups 44 are mutually interdigitated over display substrate 10, for example in an "ABC" interdigitation pattern.

Figure 4:
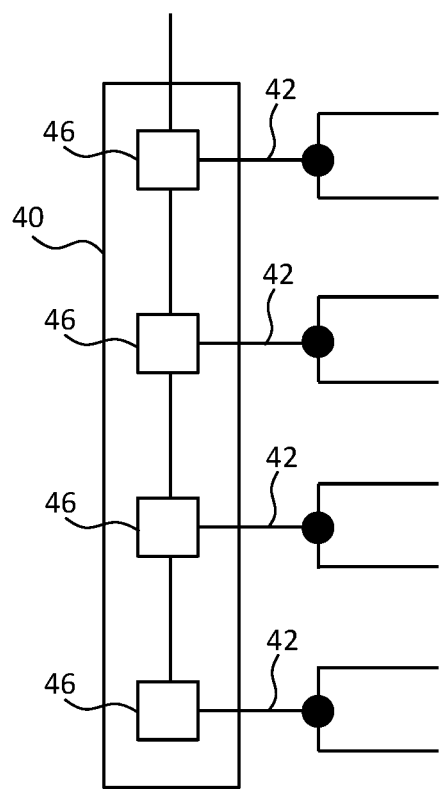
FIG. 4 is a schematic of a row controller according to illustrative embodiments of the present disclosure.

As shown in the embodiments of FIG. 4, row controller 40 can comprise token-passing circuits 46 (e.g., flip-flops arranged in a serial shift register) that pass a row-select token (e.g., a single bit of information representing a row 14 selection) through token-passing circuits 46 to control row 14 selection. Each token-passing circuit 46 can control a row-select line 42 connected to a row 14 of pixels 20 or to commonly connected rows 14 of pixels 20 in different row groups 44 (e.g., as shown in FIG. 4 and corresponding to FIG. 3).

Figure 5:
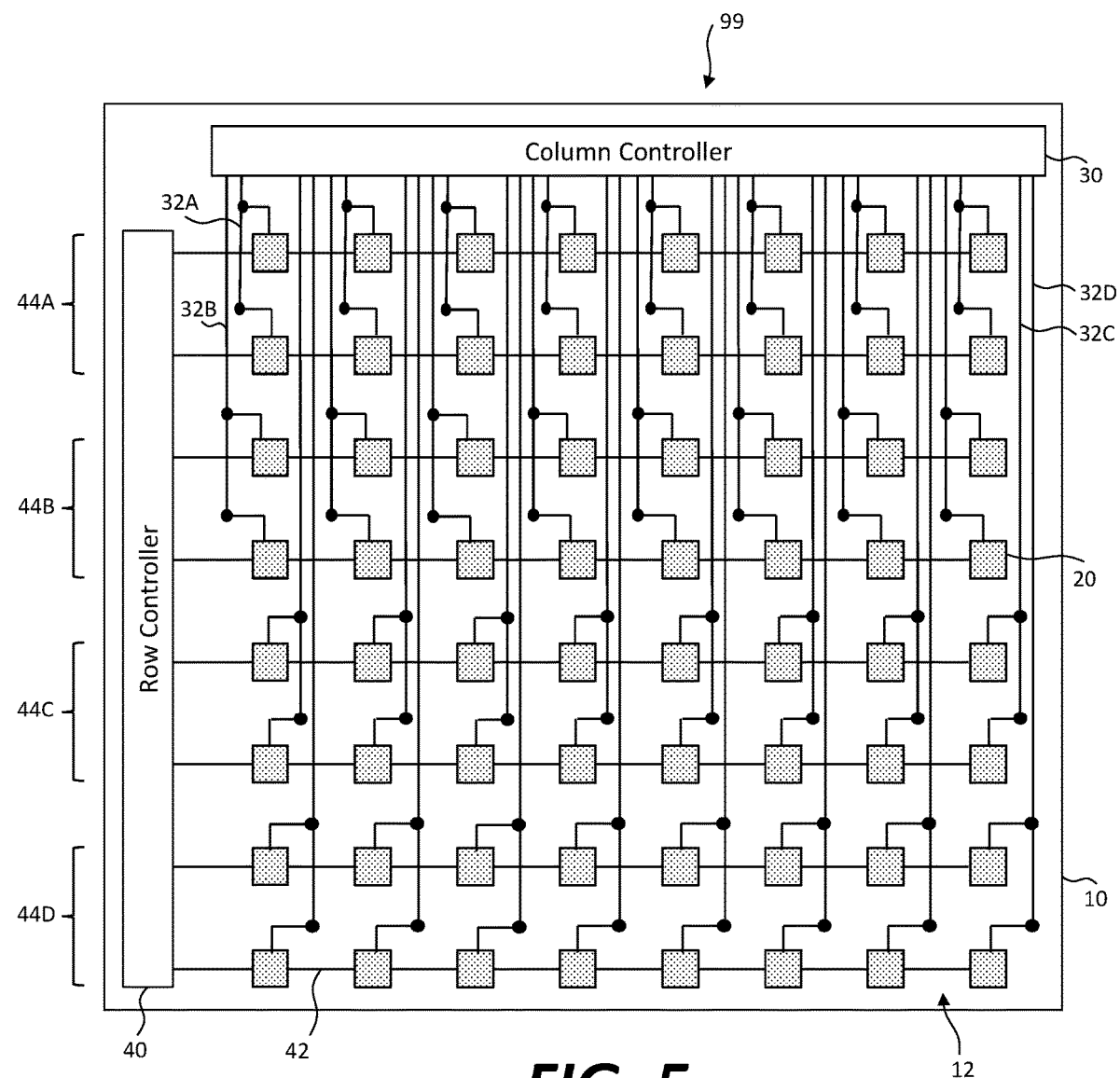
FIG. 5 is a schematic plan view of a display having four row groups according to illustrative embodiments of the present disclosure.
Figure 6:
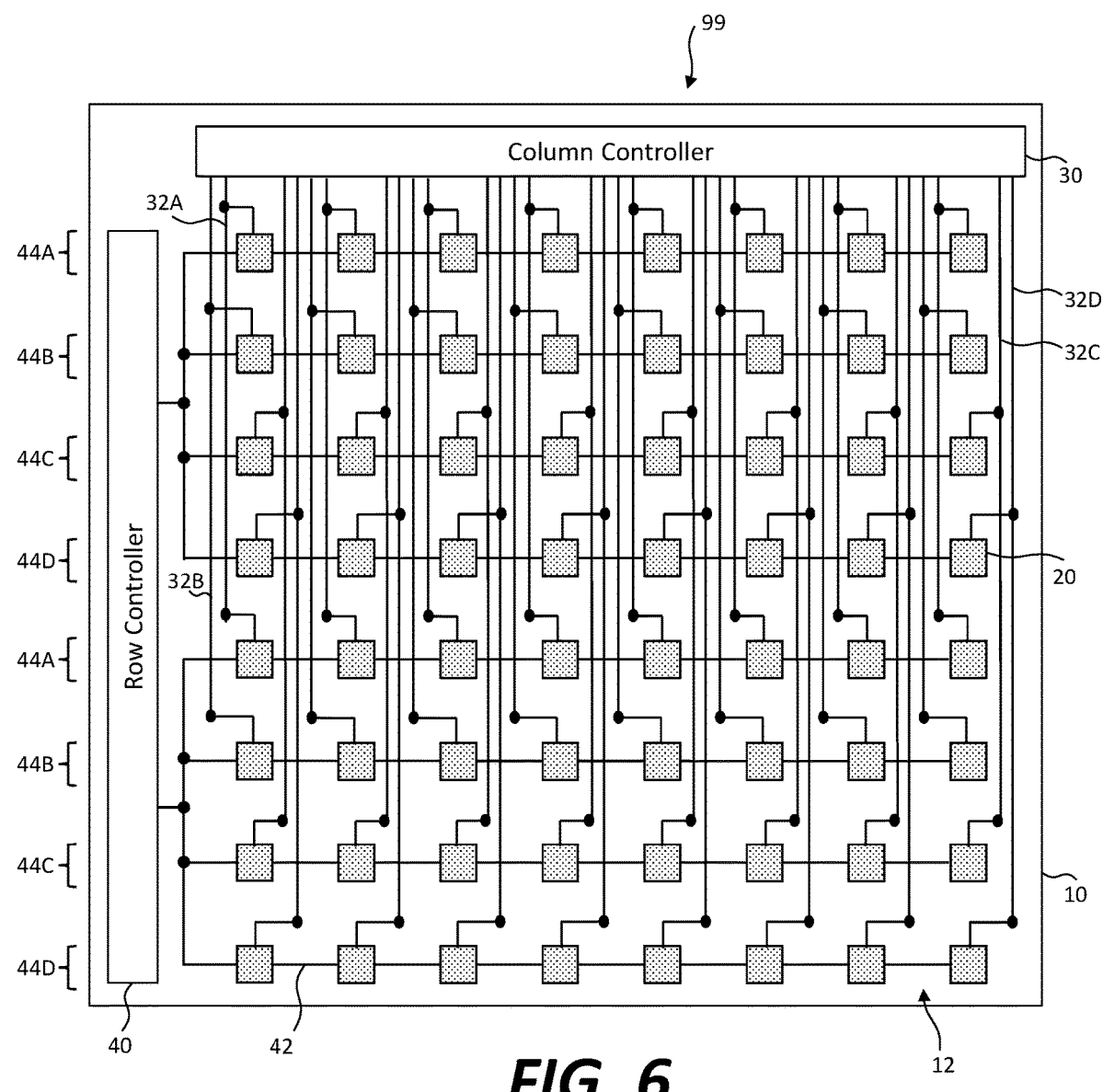
FIG. 6 is a schematic plan view of a display having four interdigitated row groups according to illustrative embodiments of the present disclosure.

Embodiments of flat-panel display 99 illustrated in FIG. 1 and FIG. 3 have two row groups 44. Embodiments illustrated in FIG. 5 have four row groups 44, row group 44A, row group 44B, row group 44C and row group 44D electrically connected to corresponding column-data lines 32A, 32B, 32C, and 32D, respectively, arranged with adjacent row groups 44, as also shown in FIG. 1. FIG. 6 illustrates embodiments with rows 14 in different row groups 44 alternating so that rows 14 of different row groups 44 are interdigitated and are arranged as in FIG. 3. In some such embodiments, four rows 14 (one in each of row groups 44A, 44B, 44C, 44D) are selected and data provided at the same time on column-data lines 32A, 32B, 32C, and 32D, so that the data rate for such a flat-panel display 99 is one quarter of the display rate (frame rate) of a flat-panel display having only one row group. In the extreme case, each row 14 can be a different row group 44 and a different column-data line 32 is connected to each pixel 20 in each column 16 of pixels 20 in each row 14. That is, an M×N array of pixels 23 would have MN column-data lines 32. For example, in an eight by eight array 12 of pixels 20, such an extreme case would comprise a column-data line 32 for every pixel 20 in array 12, totaling 64 column-data lines 32. However, in some embodiments of the present disclosure, a flat-panel display 99 has a number of row groups 44 less than the number of rows 14 in array 12 so that some column-data lines 32 are connected to more than one row 14 of pixels 20 (the more than one row 14 forming a row group 44, e.g., the some column-data lines 32 are each connected to more than one pixel 20 in a common column 16 in the row group 44).

According to some embodiments of the present disclosure and as noted with respect to FIG. 2, row controller 40 can provide timing signals to each pixel 20 in a row 14 at the same time. In some such embodiments and as shown conceptually in FIG. 7, pixel timing circuit 28 responds to timing signals 62 (e.g., a clock) to control LEDs 50 in pixel

20 to emit light. In certain active-matrix embodiments, the magnitude of the light desired is stored in pixel memory 26. In certain passive-matrix embodiments, the timing signal itself specifies the pixel brightness. The timing signals (e.g., PWM signals) can be used to control the length of time an LED 50 emits light.

According to some embodiments, each pixel 20 can comprise a pixel timing circuit 28 that internally and independently generates a timing signal controlling the brightness of pixel 20, for example in combination with digital data values stored in pixel memory 26 (for example as described in U.S. Pat. No. 10,360,846 whose contents are incorporated by reference herein in their entirety), or as an analog value stored in a capacitor (where pixel memory 26 comprises one or more capacitors, not shown in the Figures). Such digital pixel timing circuits 28 have been designed and are suitable for embodiments of the present disclosure, for example having an area in an active-matrix pixel 20 small enough to fit alongside the other elements of flat-panel display 99. In some such embodiments, internally generated timing signals need not be provided by row controller 40 or column controller 30, simplifying the row control circuitry (e.g., row controller 42) and reducing the bandwidth and frequency requirements for row-select signals on row-select lines 42 or column-data signals on column-data lines 32, as certain operations can instead be carried out locally at digital pixel timing circuits 28.

Figure 7:
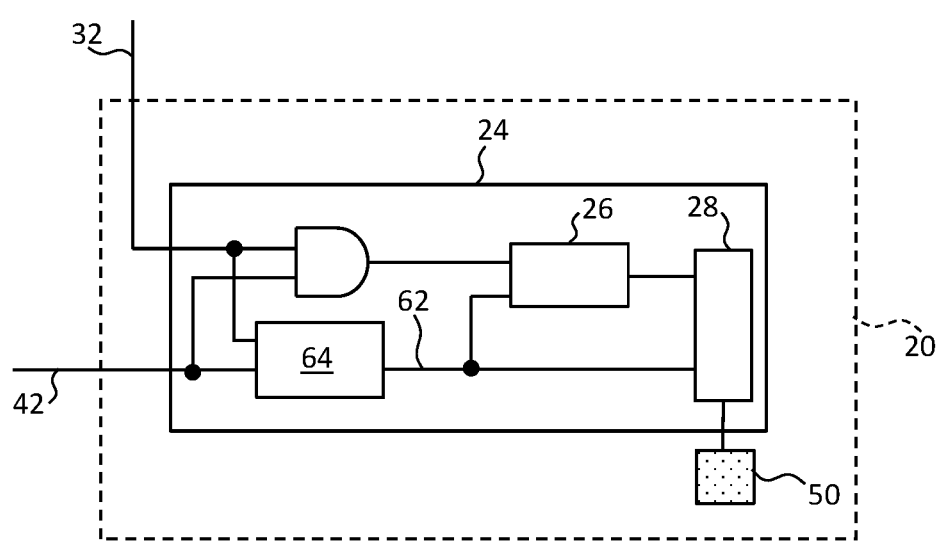
FIG. 7 is a simplified schematic of a pixel controller according to illustrative embodiments of the present disclosure.

In some embodiments and as illustrated in FIG. 7, a pixel controller 24 can input column data from column-data line 32 and a row-select signal from row-select line 42. If desired, a clock or timing signal 62 can be generated or recovered from the row-select signal or column-data signals with a clock recovery circuit 64. When a row 14 is selected, the row-select signal on row-select line 42 can be combined with the column-data signal (e.g., with an AND gate) to provide data to pixel memory 26 and timing signal 62 can enable pixel timing circuit 28 to control LEDs 50 in pixel 20 to emit light. (FIG. 7 is a simplified schematic intended to illustrate pixel controller 24 and omits circuitry that may be needed or desired to implement a complete circuit.)

Figure 8:
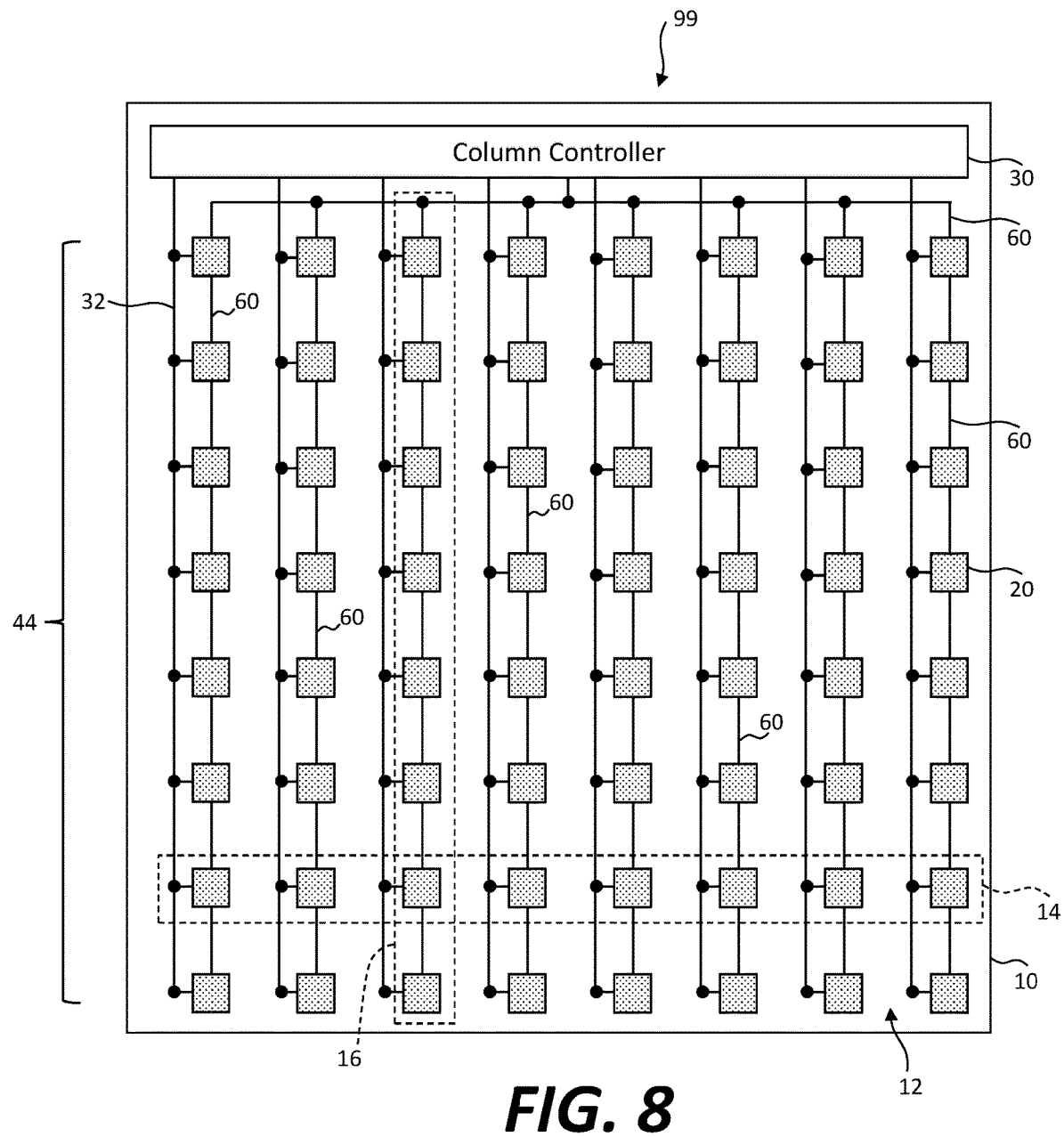
FIG. 8 is a schematic plan view of a display having serial connections according to illustrative embodiments of the present disclosure.

Embodiments illustrated in FIGS. 1-7 comprise a row controller 40. According to some embodiments of the present disclosure and as illustrated in FIG. 8, flat-panel display 99 does not comprise a row controller 40. Functions performed by row controller 40 can be performed by column controller 30 that is appropriately electrically connected to pixels 20 and by circuits internal to each pixel 20, e.g., incorporated into pixel controller 24. Some such embodiments reduce the amount of circuitry needed to control flat-panel display 99 (e.g., circuitry such as row controller circuitry external to the display area) and reduces the number of wires (e.g., row-select lines 42) and vias needed to control flat-panel display 99. Thus, embodiments of the present disclosure are useful for less complex flat-panel displays having fewer integrated circuits, fewer wires, and fewer metal layers constructed at reduced expense.

Figure 9:
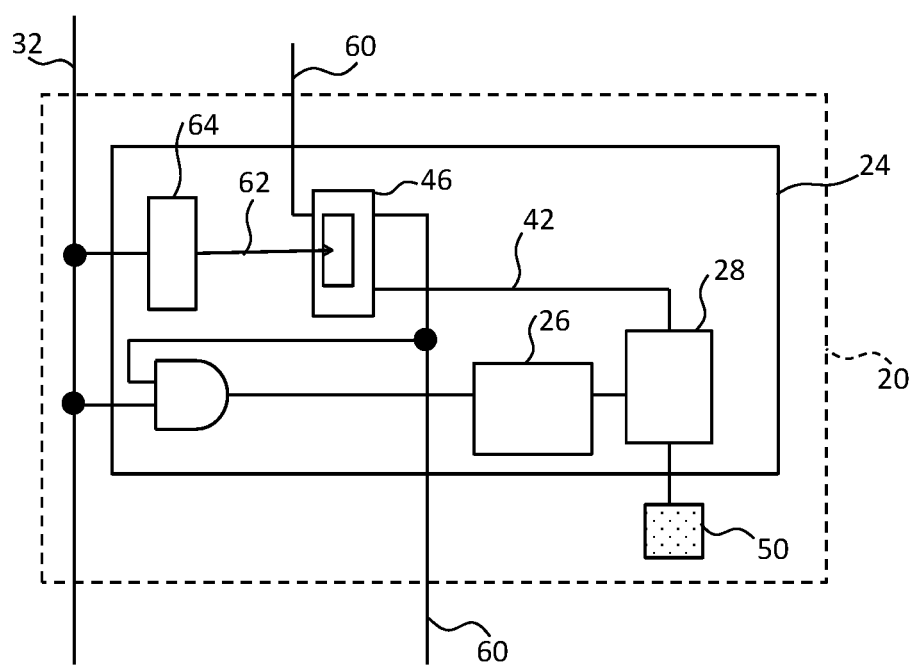
FIG. 9 is a simplified schematic of a pixel controller according to illustrative embodiments of the present disclosure.

In embodiments illustrated in FIG. 8, each pixel 20 in a column 16 is serially connected through a serial connection 60, e.g., a wire or electrical conductor that serially connects pixels 20 in a daisy chain, so that each pixel 20 in a row 14 is electrically connected directly to a neighboring pixel 20 in an adjacent row 14. Each pixel 20 comprises a token-passing circuit 46 in pixel controller 24, for example as illustrated in FIG. 9. A token (e.g., a row-selection control bit) is passed from column controller 30 into each column 16 of pixels 20 and serially and sequentially propagates from row 14 to the next adjacent row 14 in the daisy chain through serial connections 60 in response to control and column-data signals provided on column-data lines 32, thus successively enabling each row 14 of pixels 20. FIG. 8 shows only one row group 44, so each row 14 of the entire array 12 is successively and sequentially enabled and receives column data at a time communicated through column-data lines 32. Thus, according to some embodiments of the present disclosure, a flat-panel display 99 comprises a display substrate 10, an array 12 of pixels 20 distributed in rows 14 and columns 16 over display substrate 10, and a column controller 30 disposed over display substrate 10 providing data (e.g., column data or pixel data and control signals) to array 12 of pixels 20 through column-data lines 32. Each pixel 20 in each column 16 of pixels 20 in array 12 of pixels 20 can be serially connected independently of column-data lines 32 and each pixel 20 in array 12 of pixels 20 can comprise a token-passing circuit 46 for passing a row-select token through serially connected columns 16 of pixels 20. According to some embodiments, a flat-panel display 99 comprises an array 12 of pixels 20 distributed in rows 14 and columns 16 with a column controller 30 providing data to array 12 of pixels 20 and exclusively controlling pixels 20 in array 12 so that no row controller 40 is needed. Column controller 30 can comprise multiple integrated circuits, for example micro-transfer printed micro-integrated-circuits and the multiple integrated circuits can be serially connected and form, inter alia, a serial shift register. Array 12 of pixels 20 can have a column-control side 18 and column controller 30 can be disposed on column-control side 18 of array 12. Thus, according to some embodiments, flat-panel display 99 has no active devices (e.g., a row controller 40 or an integrated circuit) on any side of flat-panel display 99 except column-control side 18, thereby reducing the bezel sizes of those sides. According to some embodiments, a convex hull surrounding and including pixels 20 form a display area and flat-panel display 99 includes only wires on display substrate 10 outside of the display area, except on column-control side 18 of display substrate 10. In some embodiments, the number of control or data wires (e.g., column-data lines 32) on a side of array 12 other than column-control side 18 is equal to the number of row groups 44.

FIG. 9 is a simplified schematic illustrating embodiments of pixel controller 24 in pixel 20 useful for flat-panel displays 99, for example as illustrated in FIG. 8. Pixel controller 24 is responsive to column-data line 32 to generate a timing signal 62 with a clock recovery circuit 64. Timing signal 62 controls token-passing circuit 46 (e.g., comprising a flip-flop that, in combination with other pixels 20 in a common column 16, forms a serial shift register). Token-passing circuit 46 can also generate a row-select signal that enables pixel memory 26 to store column data. In response to stored column data (specifying the desired brightness of LEDs 50), pixel timing circuit 28 controls LEDs 50 to emit light, for example using internally generated PWM and binary logarithmic signals or delta sigma signals to control the time for which a constant current is provided to LEDs 50. The use of PWM enables a constant current control of LEDs 50, improving their efficiency. In analog embodiments, pixel memory 26 can comprise capacitors that discharge current through LEDs 50 so that pixel timing circuit 28 is not needed.

Figure 10:
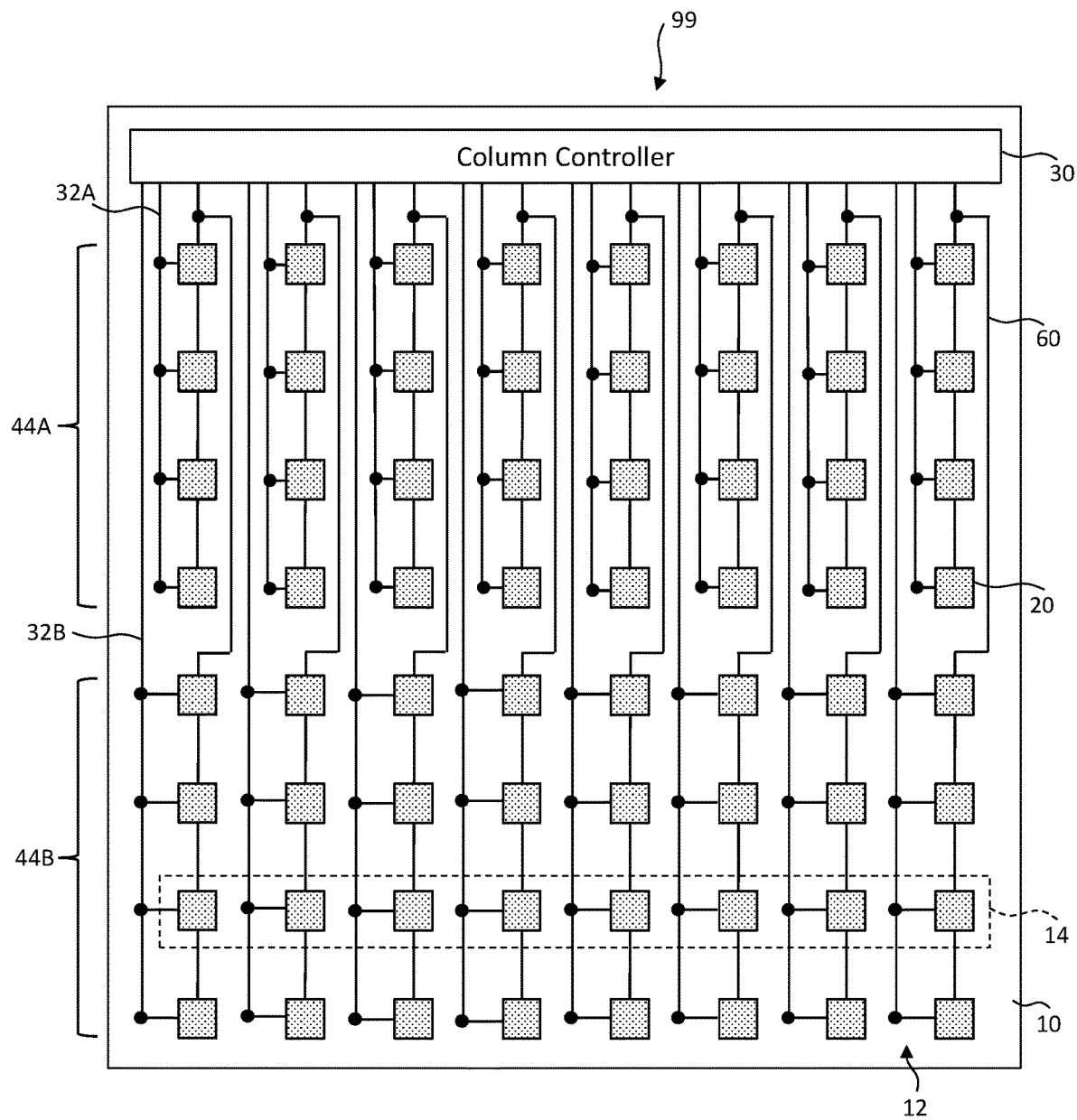
FIG. 10 is a schematic plan view of a display having two row groups and serial connections according to illustrative embodiments of the present disclosure.

FIG. 10 illustrates embodiments of the present disclosure comprising more than one row group 44. Each of two row groups, 44A and 44B, has a separate serial connection 60 for row-select token passing so that both row group 44A and row group 44B simultaneously receive a row-select token directly from column controller 30. The respective column-data lines 32A and 32B for each of row groups 44A and 44B can then simultaneously transmit column data and successive rows 14 in each row group 44 are sequentially selected to receive their respective column data. Thus, in some such embodiments, each pixel 20 in each column 16 of pixels 20 in a row group 44 is serially connected and each pixel 20 in array 12 of pixels 20 comprises a token-passing circuit 46 for passing a row-select token through serially connected columns 16 of pixels 20 in row group 44 with serial connection 60. In this configuration, no row controller 40 or row-select lines 42 are needed and the data rate on each column-data line 32 is one half that of embodiments illustrated in FIG. 8, improving signal-to-noise quality of column data signals on column-data lines 32 and reducing the number of wires and display control logic.

Figure 11:
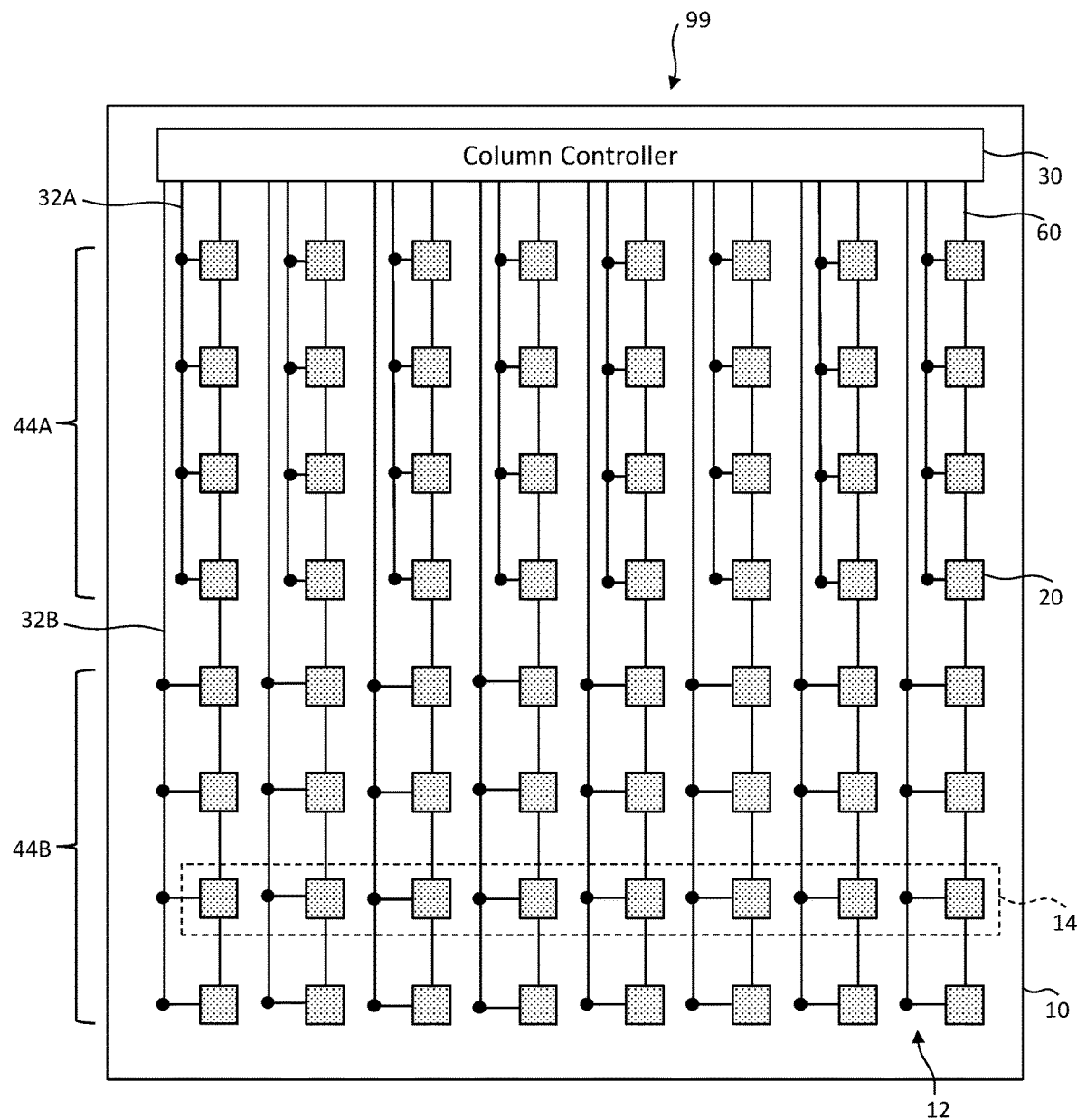
FIG. 11 is a schematic plan view of a display having two row groups and serial connections between row groups according to illustrative embodiments of the present disclosure.

In embodiments illustrated in FIG. 11, serial connections 60 pass row-select tokens from each row group 44 to the next adjacent row group 44 over display substrate 10 so that each row group 44 is initially successively rather than simultaneously enabled. In some such embodiments, column controller 30 is directly connected to a row 14 of pixels 20 in only one row group 44 (e.g., row group 44A), pixels 20 in each column 16 are serially connected, and each pixel 20 in array 12 of pixels 20 comprises a token-passing circuit 46 for passing a row-select token through serially connected column 16 of pixels 20. Thus, when first starting up flat-panel display 99, only first row group 44 (e.g., row group 44A) connected to column controller 30 is enabled, but thereafter each row group 44 (e.g., row group 44B) is successively enabled. When first row group 44A passes a row-select token to second row group 44B, column controller 30 also passes another row-select token to first row 14 of first row group 44A, so that rows 14 in both first and second row groups 44A, 44B are simultaneously enabled, as in FIG. 10. Since display frame rates are typically fractions of a second, the start-up delay needed to successively enable each row group 44 will not be noticeable to a viewer of flat-panel display 99. Such an arrangement reduces the extent of wires (e.g., serial connections 60) disposed over display substrate 10.

Figure 12:
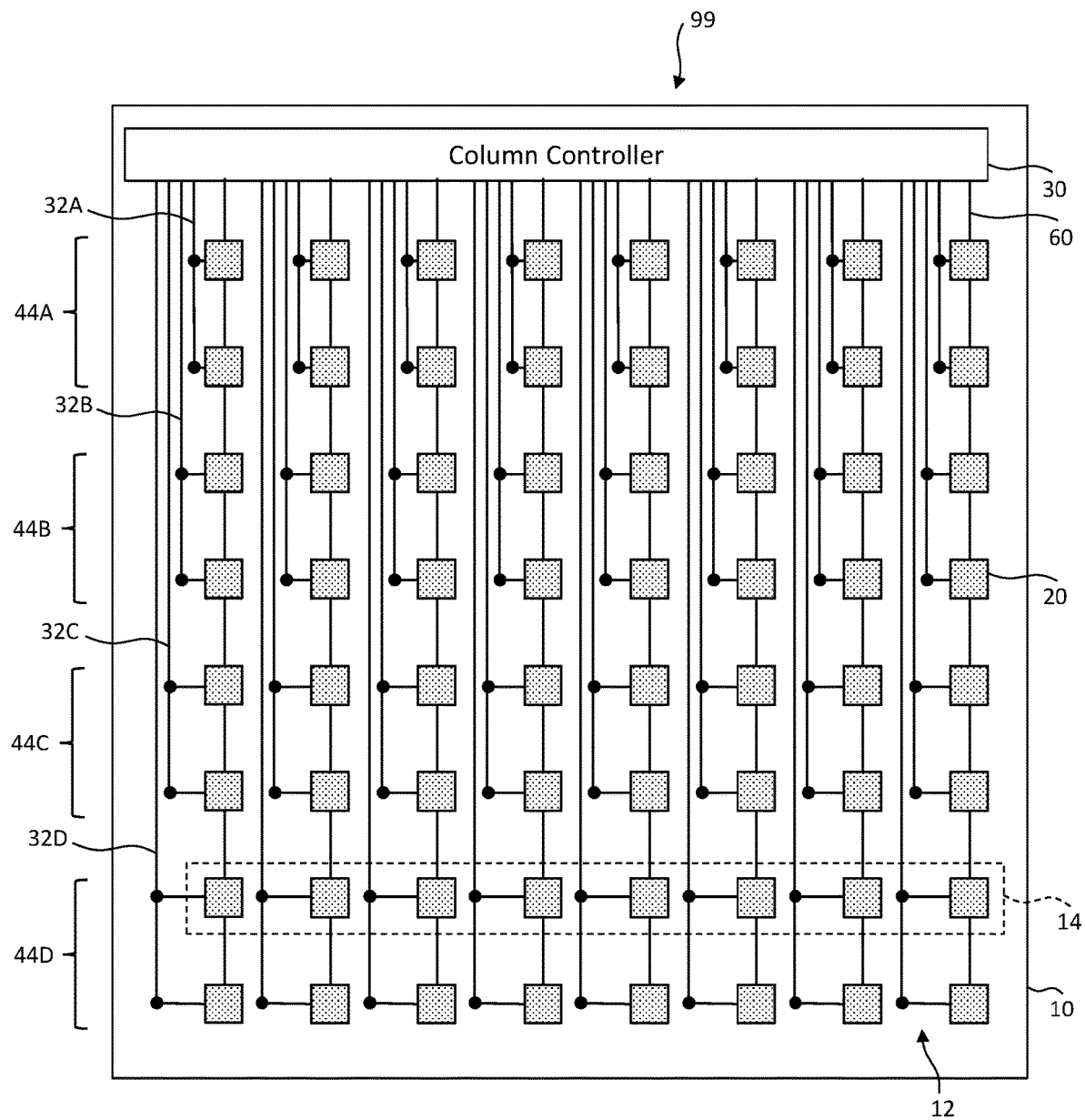
FIG. 12 is a schematic plan view of a display having four row groups and serial connections according to illustrative embodiments of the present disclosure.

FIG. 12 illustrates embodiments in which array 12 of pixels 20 comprises four row groups 44 (e.g., row group 44A, row group 44B, row group 44C, and row group 44D) and each row group 44 is connected to a separate set of column-data lines 32 (e.g., first column-data line 32A is connected to row group 44A, second column-data line 32B is connected to row group 44B, third column-data line 32C is connected to row group 44C, and fourth column-data line 32D is connected to row group 44D). Although not illustrated in FIG. 12, rows 14 of row groups 44 can be interdigitated, for example as shown in FIGS. 3 and 6.

According to some embodiments of the present disclosure, each serial connection 60 provides a daisy chain connection between pixels 20 in a single column 16 of a row group 44. If flat-panel display 99 comprises a single row group 44, as in FIG. 8, a separate and independent serial connection 60 connects all of pixels 20 in an entire column 16 of array 12. No serial connection 60 electrically connects pixels 20 in different columns 16 and each serial connection 60 of each column 16 in each row group 44 is electrically independent of any other serial connection 60, although serial connections 60 can initially be driven by a common signal from column controller 30 (e.g., to first row 14 of pixels 20 in a row group 44, as in FIGS. 11 and 12). Although the row-select token signals propagated between pixels 20 in separate rows 14 in a row group 44 are the same, by electrically separating the row-select token signals in different columns 16 into separate and independent serial connections 60 and by providing a pixel timing circuit 28 in each pixel 20, no control or timing signals (e.g., timing signals 62) extending from one column 16 to another is necessary, in contrast to row-select lines 42 controlled by a row controller 42 that extends control or timing signals to pixels 20 in multiple columns 16 (e.g., as shown in FIG. 1). Thus, less logic and fewer wires need be disposed on display substrate 10 in embodiments in accordance with FIGS. 10-13. In some such embodiments, local timing signals can be independently generated in each pixel 20.

In general, and according to embodiments of the present disclosure, a display (e.g., flat-panel display 99) can comprise an array 12 of pixels 20 distributed in M rows 14 and N columns 16, array 12 having a column-control side 18. Rows 14 of pixels 20 in array 12 of pixels 20 form G row groups 44, where G is greater than one. A column controller 30 can be disposed on column-control side 18 of array 12 and display substrate 10 providing column data to array 12 of pixels 20 through N×G separate column-data lines 32. In embodiments comprising serial connections 60 between pixels 20 in rows 14, flat-panel display 99 can have a relatively small bezel on sides other than column-control side 18 of array 12 and display substrate 10 and need be connected on only one side of display substrate 10, reducing the form factor of display substrate 10 and flat-panel display 99. A row controller 40 and row-select lines 42 are unnecessary and the remaining control lines (e.g., column-data lines 32 and serial connections 60) extend in a common direction over display substrate 10, providing a simpler wire layout of wider wires having lower resistance and better signal conduction, as well as reduced data rates, providing improved signal integrity. Such improved signal integrity can be helpful for large displays, for example having a diagonal of 0.5 meters to 10 meters, where signals travel over extended wire lengths.

Figure 13:
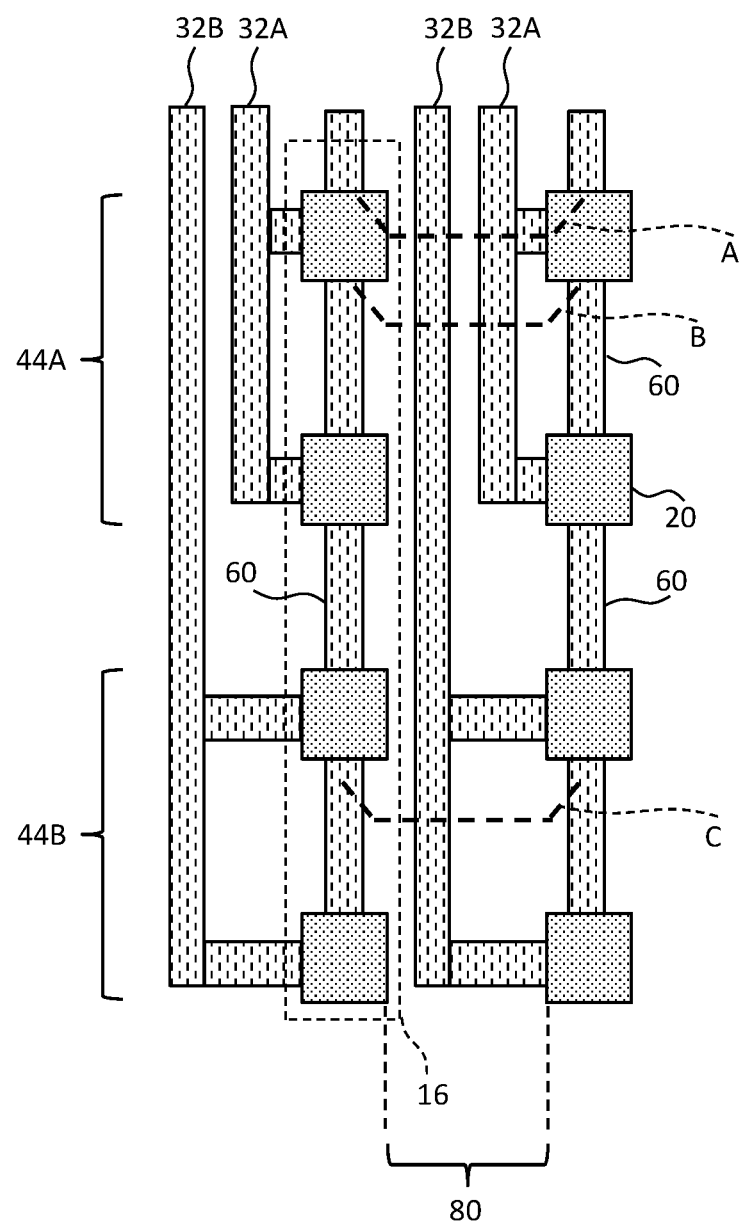
FIG. 13 is a schematic plan view of a display having wires between pixels in a display area and according to illustrative embodiments of the present disclosure.

According to some embodiments of the present disclosure and as illustrated in FIG. 13, wires, power lines, ground lines, or signal lines (e.g., column-data lines 32) disposed between pixels 20 in row groups 44 (e.g., row group 44A, row group 44B) can together occupy a significant portion of area 80 between columns 16 of pixels 20. For example, the wiring can occupy no less than 5% (e.g., no less than 10%, no less than 20%, no less than 30%, no less than 40%, no less than 50%, no less than 60%, no less than 70%, no less than 80%, or no less than 90%) of an area 80 between columns 16 of pixels 20, for example area 80 between columns 16 within array 12, for example a display area comprising a convex hull of pixels 20. As illustrated in FIG. 13, at cross section line A, wiring occupies approximately 60% of area 80, at cross section line B wiring occupies approximately 40% of area 80, and at cross section line C wiring occupies approximately 20% of area 80 (assuming for this purpose only that the referenced Figures are drawn to scale). In some embodiments, wiring occupies no less than 5% (e.g., no less than 10%, no less than 20%, no less than 30%, no less than 40%, no less than 50%, no less than 60%, no less than 70%, no less than 80%, or no less than 90%) of a display area of flat-panel display 99, for example a display area comprising a convex hull of pixels 20 in array 12. Using larger amounts of the display area for wires (e.g., 40%) improves the conductivity of the wires and can reduce the number of integrated circuits on display substrate 10.

Embodiments of the present disclosure are illustrated in the flow diagrams of FIGS. 14-19. According to some embodiments and referring to the plan view of FIGS. 1 and 3 and the flow diagram of FIG. 14, a method of controlling a flat-panel display 99 comprises providing flat-panel display 99 in step 100, providing first column data on first column-data line 32A to a first column 16 of pixels 20 in a first row group 44A by column controller 30 in step 110 and providing second column data on a second column-data line 32B to a second column 16 of pixels 20 in a second row group 44B by column controller 30 in step 120, where the receiving rows 14 are selected through row-select lines 42, e.g., by row-controller 40. First column-data line 32A and second column-data line 32B are different column-data lines 32 and the first column data and the second column data are provided concurrently and at the same time. First column 16 of pixels 20 in first row group 44A and second column 16 of pixels 20 in second row group 44B can be in a common column 16 of array 12 of pixels 20. Row controller 40 can then select different rows 14 in both first and second row groups 44A, 44B and the process repeats until the entire array 12 of pixels 20 are loaded with data, after which the process begins anew for a second image frame.

According to some embodiments and referring to the plan view of FIGS. 8 and 10-12, a method of controlling a flat-panel display 99 comprises providing flat-panel display 99 in step 100 and providing a row-select token to a row 14 of pixels 20 in each row group 44 by column controller 30 as shown in FIG. 8 (for one row group 44). According to some embodiments and the flow diagram of FIG. 15A, a row-select token is provided by column controller 30 to a row 14 of pixels 20 in each row group 44 (e.g., to first row group 44A in step 130 and to second row group 44B in step 140) at the same time as shown in FIG. 10, after which column data can be provided to the selected rows 14 by column controller 30 on control-data lines 32A, 32B. The row-select tokens are then serially passed through columns 16 of pixels in each row group 44 and column data successively provided to each selected row 14.

Figure 15A:
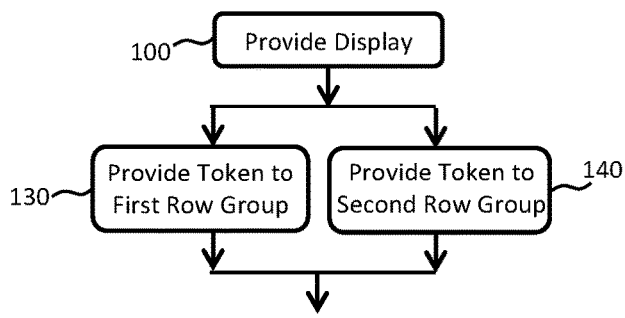
Figure 15B:
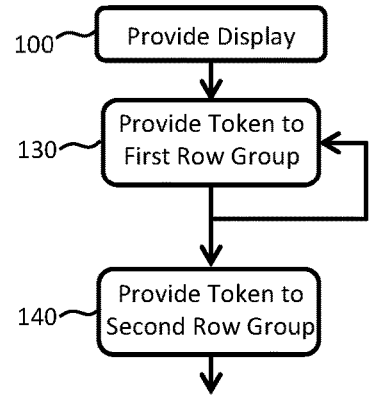

According to some embodiments and as shown in FIGS. 11 and 12 and the flow diagram of FIG. 15B, a row-select token is provided to a single row 14 of pixels 20 in array 12 of pixels 20 by column controller 30, even when array 12 comprises more than one row group 44, and the row-select token is passed from last row 14 of first row group 44A to first row 14 of second row group 44B. At the same time, a second row-select token is provided by column controller 32 to first row 14 of the first row group 44A so that a row 14 of pixels 20 in both first and second row groups 44A, 44B are simultaneously selected. In any of these cases, once a row 14 of pixels 20 has received a row-select token, column-data lines 32 can provide column data from column controller 30 to pixels 20 in selected rows 14.

Figure 16:
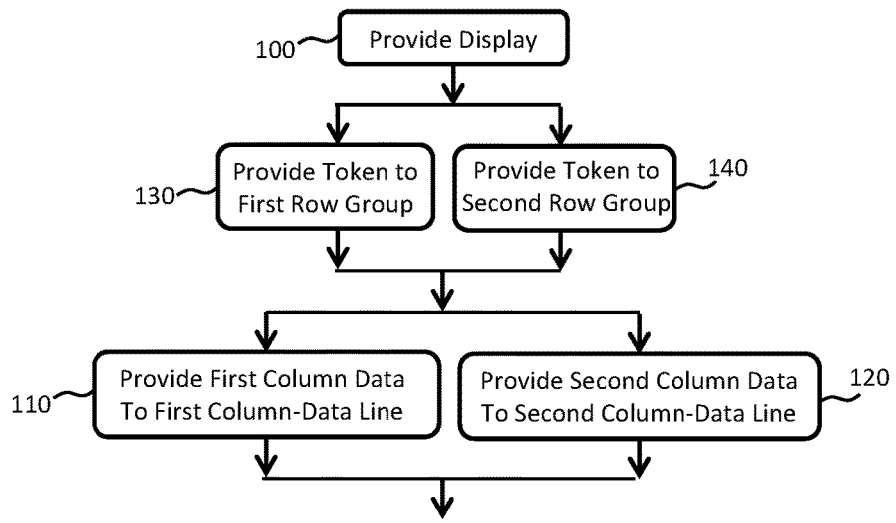

As illustrated in the flow diagram of FIG. 16 and the schematic plan view of FIG. 10, according to some embodiments a flat-panel display 99 is provided in step 100 and row-select tokens are simultaneously provided to a row 14 of pixels 20 in first and second row groups 44A and 44B in steps 130 and 140, respectively. First column data is provided on first column-data line 32A to a first column 16 of pixels 20 in first row group 44A by column controller 30 in step 110 and second column data is provided on second column-data line 32B to a second column 16 of pixels 20 in second row group 44B by column controller 30 in step 120.

Figure 14:
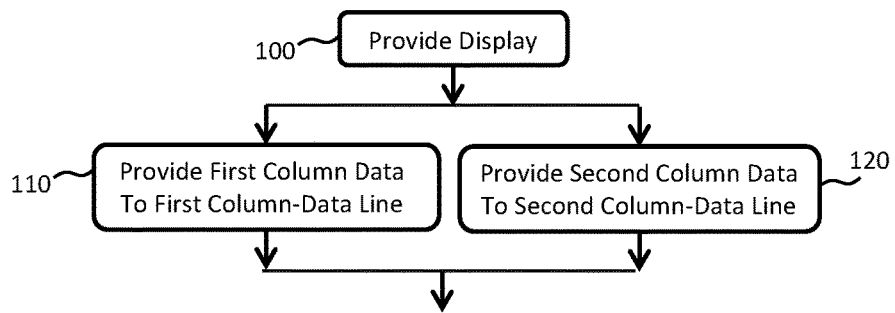
FIGS. 14-19 are flow diagrams of methods according to illustrative embodiments of the present disclosure.
Figure 17:
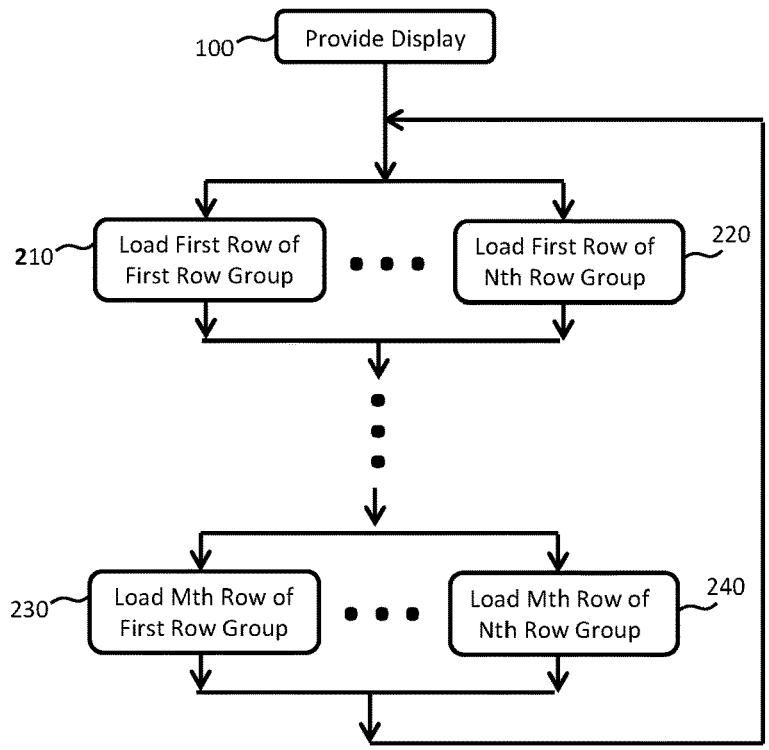

More generally and as illustrated in FIG. 17 for a flat-panel display 99, for example as shown in FIGS. 1, 3, 5, 6 10-12, and corresponding to the two-row-group 44 case of FIG. 14, in some embodiments, a flat-panel display 99 with N row groups 44 and M rows 14 in each row group 44 is provided in step 100, a first row 14 in each of the N row groups 44 is selected by row-select lines 42 and provided with column data (e.g., ranging from the first row 14 of first row group 44A in step 210 to the first row 14 of the Nth row group 44 in step 220) through column-data lines 32. Subsequently, successive rows 14 ranging from row 2 to row M in each row group 44 are selected and provided with column data (e.g., row M of first row group 44A in step 230 to row M of the Nth row group 44 in step 240). The loading process is then repeated.

Figure 18:
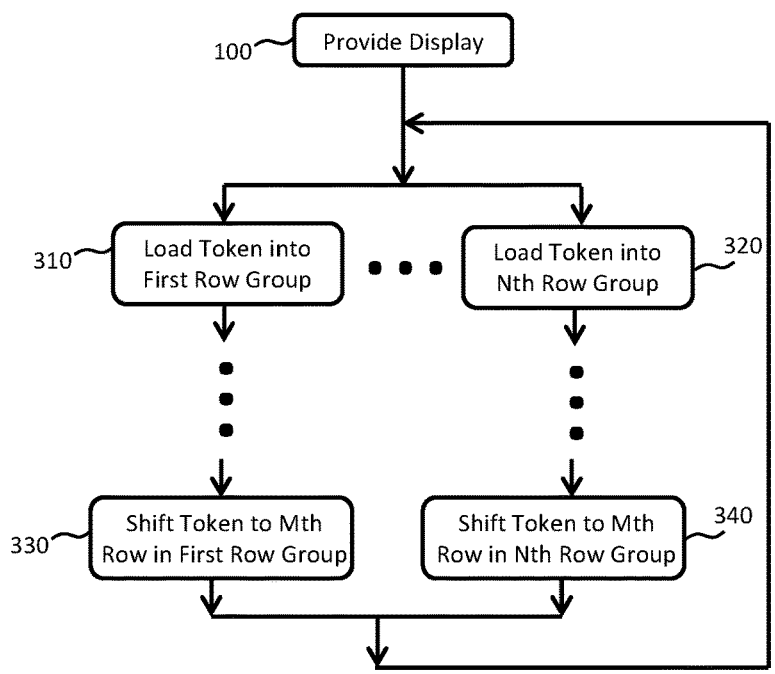

As illustrated in FIG. 18 and with reference to FIG. 10 and corresponding to the two-row-group 44 case of FIG. 15A, in some embodiments for a flat-panel display 99 with N row groups 44 and M rows 14 in each row group 44 provided in step 100, a first row 14 in each of the N row groups 44 is provided with a row-select token (e.g., ranging from the first row 14 of first row group 44A in step 310 to first row 14 of the Nth row group 44 in step 320) through serial connections 60 and then selected rows 14 of each row group 44 are loaded with column data through column-data lines 32. Subsequently, the row-select token is serially passed through serial connections 60 to successive rows 14 ranging from row 2 to row M in each row group 44 (e.g., row M of first row group 44A in step 330 to row 14M of the Nth row group 44 in step 340) and then selected rows 14 of each row group 44 loaded with column data through column-data lines 32. The row-select token passing and row 14 loading process is then repeated within each row group 44.

Figure 19:
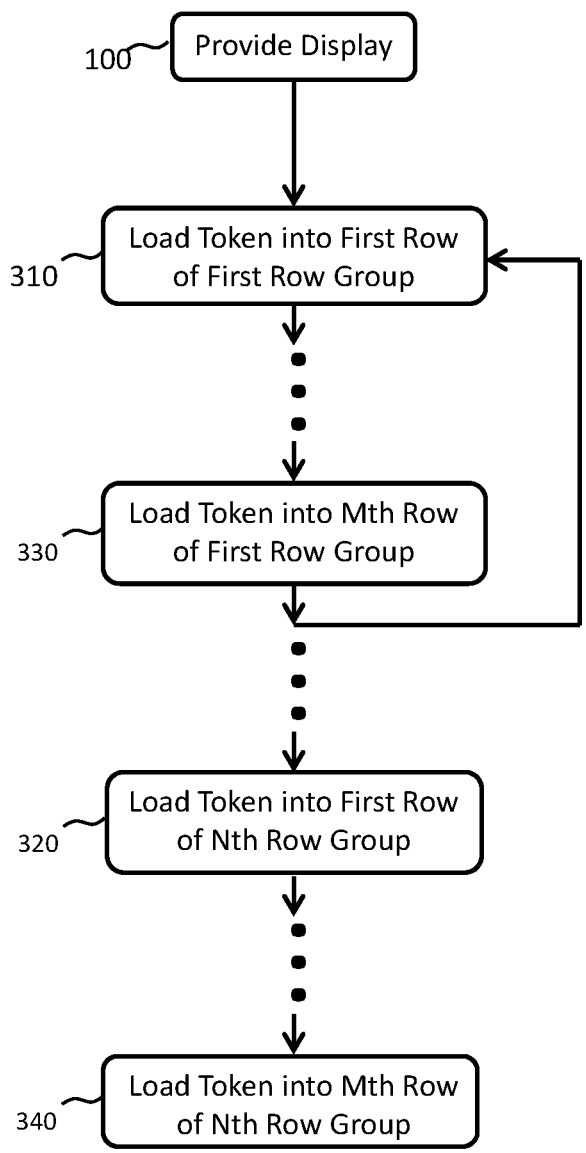

As illustrated in FIG. 19 and with reference to embodiments shown in FIGS. 11-12 and corresponding to the two-row-group 44 case of FIG. 15B in which row-select tokens are successively passed through entire columns 16 of array 12 of pixels 20 in multiple row groups 44, a flat-panel display 99 with N row groups 44 and M rows 14 in each row group 44 is provided in step 100. In step 310 a row-select token is provided for each pixel 20 in a first row 14 of array 12 of pixels 20. Column data is also provided on each column-data line 32 to the selected row 14. Subsequently, the row-select token is serially passed from first row 14 through first row group 44 to row 14M and then through the second row group 44 until the row-select token reaches first row 14 of the Nth row group 44 and then to the Mth row 14 of the Nth row group 44, at which point the entire display is loaded. After every row 14 in a row group 44 (e.g., first row group 44A) has received the row-select token, a new row-select token is provided by column controller 30 to first row group 44A so that eventually a row 14 in every row group 44 is selected at the same time so that column data can be simultaneously loaded into every row group 44, thereby reducing the data rate necessary to load flat-panel display 99 for a given frame rate by a factor equal to the number of row groups 44.

Pixels 20 and LEDs 50 can be made in multiple integrated circuits non-native to display substrate 10. The multiple integrated circuits can be micro-elements, for example, micro-transfer printed onto display substrate 10 or onto pixel substrate 22 (e.g., as shown in FIG. 2) and pixel substrate 22 micro-assembled (e.g., micro-transfer printed) onto display substrate 10. The multiple integrated circuits can be small, unpackaged integrated circuits such as unpackaged dies interconnected with wires connected to contact pads on the integrated circuits, for example formed using photolithographic methods and materials. In some embodiments, the integrated circuits are made in or on a semiconductor wafer and have a semiconductor substrate. Display substrate 10 or pixel substrate 22, or both, can include glass, resin, polymer, plastic, or metal. Pixel substrate 22 can be a semiconductor substrate and one or more of pixel controller 24, pixel memory 26, pixel timing circuit 28, and an LED drive circuit are formed in or on pixel substrate 22 (and thus are native to pixel substrate 22). Semiconductor materials (for example doped or undoped silicon, GaAs, or GaN) and processes for making small integrated circuits are well known in the integrated circuit arts. Likewise, backplane substrates and means for interconnecting integrated circuit elements on the backplane are well known in the display and printed circuit board arts.

Micro-elements, such as LEDs 50 or circuit(s) included in pixels 20, can have an area of, for example, not more than 50 square microns, not more than 100 square microns, not more than 500 square microns, or not more than 1 square mm and can be only a few microns thick, for example, no more than 5 microns, no more than 10 microns, no more than 20 microns, or no more than 50 microns thick.

In a method according to some embodiments of the present disclosure, integrated circuits are disposed on the display substrate 10 by micro transfer printing. In some methods, integrated circuits (or portions thereof) or LEDs 50 are disposed on pixel substrate 22 to form a heterogeneous pixel 20 and pixel 20 is disposed on display substrate 10 using compound micro-assembly structures and methods, for example as described in U.S. patent application Ser. No. 14/822,868 filed Aug. 10, 2015, entitled Compound Micro Assembly Strategies and Devices. However, since pixels 20 can be larger than the integrated circuits included therein, in some methods of the present disclosure, pixels 20 are disposed on display substrate 10 using pick-and-place methods found in the printed-circuit board industry, for example using vacuum grippers. Pixels 20 can be interconnected on display substrate 10 using photolithographic methods and materials or printed circuit board methods and materials.

In certain embodiments, display substrate 10 includes material, for example glass or plastic, different from a material in an integrated-circuit substrate, for example a semiconductor material such as silicon or GaN. LEDs 50 can be formed separately on separate semiconductor substrates, assembled onto pixel substrates 22 to form pixels 20 and then the assembled units are located on the surface of the display substrate 10. This arrangement has the advantage that the integrated circuits or pixels 20 can be separately tested on pixel substrate 22 and the pixel modules accepted, repaired, or discarded before pixels 20 are located on display substrate 10, thus improving yields and reducing costs.

In some embodiments of the present disclosure, providing flat-panel display 99, display substrate 10, or pixels 20 can include forming conductive wires (e.g., row-select lines 42 and column-data lines 32) on display substrate 10 or pixel substrate 22 by using photolithographic and display substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The electrical interconnections, or wires, can be fine interconnections, for example having a width of less than fifty microns, less than twenty microns, less than ten microns, less than five microns, less than two microns, or less than one micron. Such fine interconnections are useful for interconnecting micro-integrated circuits, for example as bare dies with contact pads and used with the pixel substrates 22. Alternatively, wires can include one or more crude lithography interconnections having a width from 2 μm to 2 mm, wherein each crude lithography interconnection electrically interconnects pixels 20 on display substrate 10. For example, electrical interconnections shown in FIG. 9 can be formed with fine interconnections (e.g., relatively small high-resolution interconnections) while column-data lines 32 and/or row-select lines 42 are formed with crude interconnections (e.g., relatively large low-resolution interconnections).

In some embodiments, red, green, and blue LEDs 52, 54, 56 (e.g. micro-LEDs 50) are micro transfer printed to pixel substrates 22 or display substrate 10 in one or more transfers and can comprise fractured or separated tethers as a consequence of micro-transfer printing. For a discussion of micro-transfer printing techniques that can be used or adapted for use in methods disclosed herein, see U.S. Pat. Nos. 8,722,458, 7,622,367 and 8,506,867, each of which is hereby incorporated by reference in its entirety. The transferred light emitters are then interconnected, for example with conductive wires and optionally including connection pads and other electrical connection structures, to enable a controller (e.g., column controller 30) to electrically interact with light-controlling elements to emit, or otherwise control, light.

In some embodiments of the present disclosure, an array 12 of pixels 20 (e.g., as in FIG. 1) can include at least 40,000, 62,500, 100,000, 500,000, one million, two million, three million, six million, eight million, or thirty-two million display pixels 20, for example for a quarter VGA, VGA, HD, 4K, or 8K display having various pixel densities (e.g., having at least 50, at least 75, at least 100, at least 150, at least 200, at least 300, or at least 400 pixels per inch (ppi)). In some embodiments of the present disclosure, light emitters in pixels 20 can be considered integrated circuits, since they are formed in a substrate, for example a wafer substrate, or layer using integrated-circuit processes. The substrate or layer need not necessarily be silicon, for example III-V semiconductor wafers or layers can be used to form light emitters using integrated-circuit processes and are considered integrated circuits (or portions thereof) in the context of this disclosure.

Generally, display substrate 10 has two opposing smooth sides suitable for material deposition, photolithographic processing, or micro-transfer printing of micro-LEDs 50. Display substrate 10 can have a size of a conventional display, for example a rectangle with a diagonal of a few centimeters to one or more meters. Display substrate 10 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present disclosure, LEDs 50 emit light through display substrate 10. In some embodiments, LEDs 50 emit light in a direction opposite display substrate 10. Display substrate 10 can have a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). According to some embodiments of the present disclosure, display substrate 10 can include layers formed on an underlying structure or substrate, for example a rigid or flexible glass or plastic substrate.

In some embodiments, display substrate 10 can have a single, connected, contiguous system substrate display area (e.g., a convex hull) including pixels 20 that each have a functional area. The combined functional area of pixels 20 or LEDs 50 can be less than or equal to one-quarter of the contiguous system substrate area. In some embodiments, the combined functional areas of the plurality of pixels 20 is less than or equal to one eighth, one tenth, one twentieth, one fiftieth, one hundredth, one five-hundredth, one thousandth, one two-thousandth, or one ten-thousandth of the contiguous system substrate area. Thus, remaining area over display substrate 10 is available for additional column-data lines 32 and serial connections 60 that can cover no less than 5% (e.g., no less than 10%, 20%, 30%, 40%, 50%, 60% 70%, 80%, or 90%) of the area 80 between pixels 20 in the display area.

In some embodiments of the present disclosure, LEDs 50 are inorganic micro-light-emitting diodes 50 (micro-LEDs 50), for example having light-emissive areas of less than 10, 20, 50, or 100 square microns. In some embodiments, light emitters have physical dimensions that are less than 100 µm, for example having at least one of a width from 2 to 50 µm (e.g., 2 to 5 µm, 5 to 10 µm, 10 to 20 µm, or 20 to 50 µm), a length from 2 to 50 µm (e.g., 2 to 5 µm, 5 to 10 µm, 10 to 20 µm, or 20 to 50 µm), and a height from 2 to 50 µm (e.g., 2 to 5 µm, 5 to 10 µm, 10 to 20 µm, or 20 to 50 µm). The light emitters can have a size of, for example, one square micron to 500 square microns. Such micro-LEDs 50 have the advantage of a small light-emissive area compared to their brightness as well as color purity providing highly saturated display colors and a substantially Lambertian emission providing a wide viewing angle. Such small light emitters also provide additional space on display substrate 10 for additional column-data lines 32 and serial connections 60.

According to various embodiments, flat-panel display 99 can include a variety of designs having a variety of resolutions, light emitter sizes, and displays having a range of display substrate 10 areas.

Pixels 20 of flat-panel display 99 can be arranged in a regular array (e.g., as shown in FIG. 1) or an irregular array on display substrate 10.

In some embodiments, LEDs 50 are formed in substrates or on supports separate from display substrate 10. For example, LEDs 50 or pixel controller 24 are separately formed in a semiconductor wafer. LEDS 50 or pixel controllers 24 are then removed from the wafer and transferred, for example using micro-transfer printing, to display substrate 10 or pixel substrate 22. Such arrangements have the advantage of using a crystalline semiconductor substrate that provides higher-performance integrated circuit components than can be made in the amorphous or polysilicon semiconductor available in thin-film circuits on a large substrate such as display substrate 10. Such micro-transferred LEDs 50 or pixel controllers 24 can comprise a fractured or separated tether as a consequence of a micro-transfer printing process.

By employing a multi-step transfer or assembly process, increased yields are achieved and thus reduced costs for flat-panel displays 99 of the present disclosure. Additional details useful in understanding and performing aspects of the present disclosure are described in U.S. patent application Ser. No. 14/743,981, filed Jun. 18, 2015, entitled Micro Assembled Micro LED Displays and Lighting Elements, the disclosure of which is hereby incorporated by reference herein in its entirety.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

As is also understood by those skilled in the art, the terms "column" and "row", "horizontal" and "vertical", and "x" and "y" are arbitrary designations that can be interchanged (unless otherwise clear from context).

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular express reference to certain embodiments thereof, but it will be understood that variations and modifications can be effected within the spirit and scope of the following claims.

PARTS LIST

A cross section line
B cross section line
C cross section line
L length
10 display substrate
12 array
14 row
16 column
18 column-control side
20 pixel
22 pixel substrate
24 pixel controller
26 pixel memory
28 pixel timing circuit
30 column controller
32 column-data line
32A first column-data line
32B second column-data line
32C third column-data line
32D fourth column-data line
40 row controller
42 row-select line/row-select signal
44 row group
44A row group
44B row group
44C row group
44D row group
46 token-passing circuit
50 light emitter/light-emitting diode (LED)/micro-light-emitting diode (micro-LED)
52 red light-emitting diode
54 green light-emitting diode
56 blue light-emitting diode
60 serial connection
62 timing signal
64 clock recovery circuit
80 area
99 flat-panel display
100 provide display step 110 provide first column data to first column-data line step
120 provide second column data to second column-data line step
130 provide token to first row group step
140 provide token to second row group step
210 load first row of first row group step
220 load first row of Nth row group step
230 load Mth row of first row group step
240 load Mth row of Nth row group step
310 load token into first row group step
320 load token into Nth row group step
330 shift token to Mth row in first row group step
340 shift token to Mth row in Nth row group step

What is claimed:

1. A flat-panel display, comprising:
   a display substrate;
   an array of pixels distributed in rows and columns over the display substrate, the array having a column-control side, each of the pixels comprising one or more light-controlling elements; and
   a column controller disposed on the column-control side of the array operable to provide column data to the pixels in the array through column-data lines and to provide a row-select token to one or more pixels in each of the columns of pixels through a serial connection to the one or more pixels,
   wherein the rows of pixels in the array of pixels are arranged in one or more row groups, and
   wherein, for each row group of the one or more row groups, each column of pixels in the row group receives column data from the column controller through a separate one of the column-data lines, and no pixel of the array of pixels in any other row group receives column data through the separate one of the column-data lines,
   wherein for each column of the pixels in each of the one or more row groups, each pixel in the column of the row group is directly serially connected with a separate serial connection to a neighboring pixel forming a daisy chain in the column of the row group, and each pixel in the array of pixels comprises a token-passing circuit for passing a row-select token through each column of serially connected pixels in each of the row groups.

2. The flat-panel display of claim 1, wherein each pixel in the array comprises one or more inorganic micro-light-emitting-diodes.

3. The flat-panel display of claim 2, wherein each of the one or more inorganic micro-light-emitting-diodes has a length and a width each no greater than 200 microns.

4. The flat-panel display of claim 3, wherein wiring occupies no less than 5% of area between the columns of pixels on a surface of the display substrate on which the pixels are disposed.

5. The flat-panel display of claim 1, wherein each of the pixels comprises a pixel timing circuit.

6. The flat-panel display of claim 1, wherein the number of row groups is greater than two.

7. The flat-panel display of claim 1, wherein (i) the column controller provides a row-select token directly to at least one row of pixels in each of the row groups or (ii) the column controller provides a row-select token directly to at least one row of pixels in only one of the row groups and the row groups are serially connected.

8. The flat-panel display of claim 1, wherein each of the columns of pixels comprises pixels in two or more different ones of the row groups.

9. The flat-panel display of claim 1, wherein each column of pixels comprises pixels that are electrically connected to different ones of the column-data lines.

10. A flat-panel display, comprising:
    a display substrate;
    an array of pixels distributed in rows and columns over the display substrate, each of the pixels comprising one or more light-controlling elements; and
    a column controller operable to provide column data to the pixels in the array through column-data lines and to provide a row-select token to one or more pixels in each of the columns of pixels through a serial connection to the one or more pixels,
    wherein, for each row of the rows of pixels in the array, each pixel in the row is in a column of the array, each pixel in the row is electrically connected to a separate one of the column-data lines, and the separate column-data line is electrically connected to less than all of the pixels in the column,
    wherein for each column of the pixels, each pixel in the column is directly serially connected with a separate serial connection to a neighboring pixel forming a daisy chain in the column and each pixel in the array of pixels comprises a token-passing circuit for passing a row-select token through each column of serially connected pixels.

11. A display, comprising:
    an array of pixels distributed in M rows and N columns, the array having a column-control side, wherein rows of pixels in the array of pixels form G row groups, G greater than one, each of the pixels comprising one or more light-controlling elements; and
    a column controller disposed on the column-control side of the array operable to provide column data to the array of pixels through N×G separate column-data lines and to provide a row-select token to one or more pixels in each of the columns of pixels through a serial connection to the one or more pixels,
    wherein, for each column of the pixels, each pixel in the column is directly serially connected with a separate serial connection to a neighboring pixel forming a daisy chain in the column and each pixel in the array of pixels comprises a token-passing circuit for passing a row-select token through each column of serially connected pixels.

* * * * *